(12) United States Patent
Heo et al.

(10) Patent No.: US 11,711,949 B2
(45) Date of Patent: Jul. 25, 2023

(54) DISPLAY DEVICE

(71) Applicant: SAMSUNG DISPLAY CO., LTD., Yongin-si (KR)

(72) Inventors: Jihye Heo, Asan-si (KR); Ki Wook Kim, Hwaseong-si (KR); Eunbyul Jo, Daegu (KR); Joong-Soo Moon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 113 days.

(21) Appl. No.: 16/998,322

(22) Filed: Aug. 20, 2020

(65) Prior Publication Data
US 2021/0151533 A1 May 20, 2021

(30) Foreign Application Priority Data
Nov. 18, 2019 (KR) .................. 10-2019-0147778

(51) Int. Cl.
*H10K 59/124* (2023.01)
*H10K 50/844* (2023.01)

(52) U.S. Cl.
CPC ......... *H10K 59/124* (2023.02); *H10K 50/844* (2023.02)

(58) Field of Classification Search
CPC ............. H01L 51/5246; H01L 51/5253; H01L 27/3258; H10K 50/844; H10K 50/8426; H10K 50/124
See application file for complete search history.

(56) References Cited

U.S. PATENT DOCUMENTS

| 2015/0060778 A1* | 3/2015 | Kim ............... H10K 50/868 438/23 |
| 2016/0013253 A1* | 1/2016 | Lee ............... C23C 16/50 83/13 |

(Continued)

FOREIGN PATENT DOCUMENTS

| CN | 207637803 | 7/2018 |
| CN | 108520895 | 9/2018 |

(Continued)

OTHER PUBLICATIONS

European Search Report dated Apr. 15, 2021 from the European Patent Office issued in corresponding European Patent Application No. 20205360.9.

*Primary Examiner* — Vongsavanh Sengdara
(74) *Attorney, Agent, or Firm* — F. Chau & Associates, LLC

(57) ABSTRACT

A display device includes a substrate having a display area and a non-display area. A plurality of insulation layers are disposed on the substrate. A pixel is disposed on the substrate in the display area. The pixel includes a transistor and a light emitting element electrically connected to the transistor. A crack blocker is disposed on the substrate in the non-display area and includes a plurality of first crack block grooves defined in at least one of the plurality of insulation layers. Each first crack block grooves extends in a first direction and is arranged in a second direction crossing the first direction. A plurality of second crack block grooves is defined in at least one of the plurality of insulation layers and is adjacent to the plurality of first crack block grooves. Each second crack block grooves extends in the second direction and is arranged in the first direction.

23 Claims, 12 Drawing Sheets

(56) References Cited

U.S. PATENT DOCUMENTS

2016/0183382 A1 6/2016 Solven et al.
2017/0288004 A1* 10/2017 Kim ...................... H10K 77/10

FOREIGN PATENT DOCUMENTS

EP 2966688 1/2016
KR 10-2014-0080231 6/2014

* cited by examiner

DISPLAY DEVICE

CROSS-REFERENCE TO RELATED APPLICATION(S)

This application claims priority under 35 U.S.C. § 119 to Korean Patent Application No. 10-2019-0147778, filed on Nov. 18, 2019 in the Korean Intellectual Property Office, the disclosure of which is incorporated by reference in its entirety herein.

1. Technical Field

The present inventive concepts relate to a display device.

2. Discussion of Related Art

Display devices are electronic devices that display an image to a user for providing visual information. Recently, organic light emitting display devices have attracted attention among various types of display devices. The organic light emitting display device has self-luminous characteristics. In contrast with liquid crystal display devices, organic light emitting display devices do not require a separate light source thereby reducing the thickness and weight of the display device. The organic light emitting display device also exhibits desirable characteristics including a low power consumption, a high luminance, and a high response speed.

Display devices may be exposed to various external impacts during the manufacture and use of the display device. For example, cracks may occur at an edge of the display device due to an external impact applied to the display device. Pixels disposed in the display area may be damaged when the cracks are propagated from a non-display area that may be positioned on the edge of the display device to the display area that may be positioned in the center of the display device. Therefore, defects of the display device may occur and the performance of the display device may deteriorate.

SUMMARY

Exemplary embodiments provide a display device in which cracks propagated to various directions through insulation layers in a non-display area are blocked.

A display device according to an exemplary embodiment may include a substrate having a display area and a non-display area. A plurality of insulation layers are disposed on the substrate. A pixel is disposed on the substrate in the display area. The pixel includes a transistor and a light emitting element electrically connected to the transistor. A crack blocker is disposed on the substrate in the non-display area and includes a plurality of first crack block grooves defined in at least one of the plurality of insulation layers. Each of the plurality of first crack block grooves extends in a first direction and is arranged in a second direction crossing the first direction. A plurality of second crack block grooves is defined in at least one of the plurality of insulation layers and is adjacent to the plurality of first crack block grooves. Each of the plurality of second crack block grooves extends in the second direction and is arranged in the first direction.

In an exemplary embodiment, the plurality of second crack block grooves may be adjacent to the plurality of first crack block grooves in the first direction.

In an exemplary embodiment, the crack blocker may further include a plurality of third crack block grooves defined in the plurality of insulation layers, adjacent to the plurality of first crack block grooves in the second direction, each extending in the second direction, and arranged in the first direction.

In an exemplary embodiment, the crack blocker may further include a plurality of fourth crack block grooves defined in the plurality of insulation layers, adjacent to the plurality of third crack block grooves in the first direction, each extending in the first direction, and arranged in the second direction.

In an exemplary embodiment, the plurality of fourth crack block grooves may be adjacent to the plurality of second crack block grooves in the second direction.

In an exemplary embodiment, the second direction may be perpendicular to the first direction.

In an exemplary embodiment, the first direction may be parallel to a scan line providing a scan signal to the pixel.

In an exemplary embodiment, the first direction may form an acute angle with a scan line providing a scan signal to the pixel.

In an exemplary embodiment, an angle formed between the first direction and the scan line may be about 45 degrees.

In an exemplary embodiment, the crack blocker may have a rectangular shape in a plan view.

In an exemplary embodiment, the plurality of first crack block grooves and the plurality of second crack block grooves may have a stripe shape in a plan view.

In an exemplary embodiment, the transistor may include an active layer, a control electrode insulated from the active layer and overlapping the active layer, an input electrode insulated from the control electrode and connected to a first side of the active layer, and an output electrode insulated from the control electrode and connected to a second side of the active layer. The plurality of insulation layers may include a first insulation layer disposed between the active layer and the control electrode and a second insulation layer disposed between the control electrode and the input electrode.

In an exemplary embodiment, the plurality of insulation layers may further include a buffer layer disposed between the substrate and the active layer.

In an exemplary embodiment, each of the plurality of insulation layers may include an inorganic insulation material.

In an exemplary embodiment, the non-display area may include a bending area positioned at a side of the display area. The crack blocker may be positioned at a side of the bending area.

In an exemplary embodiment, the non-display area may include a peripheral area surrounding the display area, and the crack blocker may be positioned in the peripheral area.

In an exemplary embodiment, an upper surface of the substrate may be exposed by the plurality of first crack block grooves and the plurality of second crack block grooves.

In an exemplary embodiment, the display device may further include an encapsulation layer disposed on the pixel in the display area. The encapsulation layer may extend to cover the crack blocker and contacts the plurality of first crack block grooves and the plurality of second crack block grooves.

In an exemplary embodiment, the encapsulation layer may include a first inorganic encapsulation layer, an organic encapsulation layer disposed on the first inorganic encapsulation layer, and a second inorganic encapsulation layer disposed on the organic encapsulation layer. The first inorganic encapsulation layer and the second inorganic encapsulation layer may extend to cover the crack blocker.

In an exemplary embodiment, the light emitting element may include a first electrode, a second electrode spaced apart from the first electrode and overlapping the first electrode, and an emission layer disposed between the first electrode and the second electrode.

In an exemplary embodiment, a display device includes a substrate having a display area that includes at least one pixel and a non-display area that includes a peripheral area surrounding the display area. A plurality of insulation layers is disposed on the substrate. At least one dam is disposed on the plurality of insulation layers in the peripheral area. The at least one dam extends in a first direction. A crack blocker is disposed on the substrate in the peripheral area. The crack blocker is disposed farther from the display area than the at least one dam in a second direction that is parallel to an upper surface of the substrate. The crack blocker includes a plurality of first crack block grooves defined in at least one of the plurality of the insulation layers. Each of the plurality of first crack block grooves extends in a third direction that crosses the first direction. A plurality of second crack block grooves is defined in the plurality of insulation layers adjacent to the plurality of first crack block grooves in the second direction. The plurality of second block grooves extends in the first direction.

In an exemplary embodiment of the present inventive concepts, a display device includes a substrate having a display area that includes at least one pixel and a non-display area. A plurality of insulation layers is disposed on the substrate. A crack blocker is disposed on the substrate in the non-display area. The crack blocker includes a plurality of sets of crack block grooves defined in at least one of the plurality of the insulation layers and arranged adjacent to each other in a first direction parallel to an upper surface of the substrate and/or a second direction that is parallel to the upper surface of the substrate and perpendicular to the first direction. Each set of crack block grooves includes a plurality of crack block grooves that extend in a direction that is different from each of the plurality of crack block grooves of an adjacent set of crack block grooves.

In the display device according to the exemplary embodiments, the crack blocker disposed in the non-display area may include: the first crack block grooves defined in the insulation layers, each extending in the first direction and arranged in the second direction; and the second crack block grooves defined in the insulation layers, each extending in the second direction and arranged in the first direction. Accordingly, the cracks propagated in various directions through the insulation layers may be blocked by the crack blocker.

BRIEF DESCRIPTION OF THE DRAWINGS

Illustrative, non-limiting exemplary embodiments will be more clearly understood from the following detailed description of exemplary embodiments taken in conjunction with the accompanying drawings.

DETAILED DESCRIPTION OF EXEMPLARY EMBODIMENTS

Hereinafter, display devices in accordance with exemplary embodiments of the present inventive concepts will be explained in detail with reference to the accompanying drawings.

Figure 1:
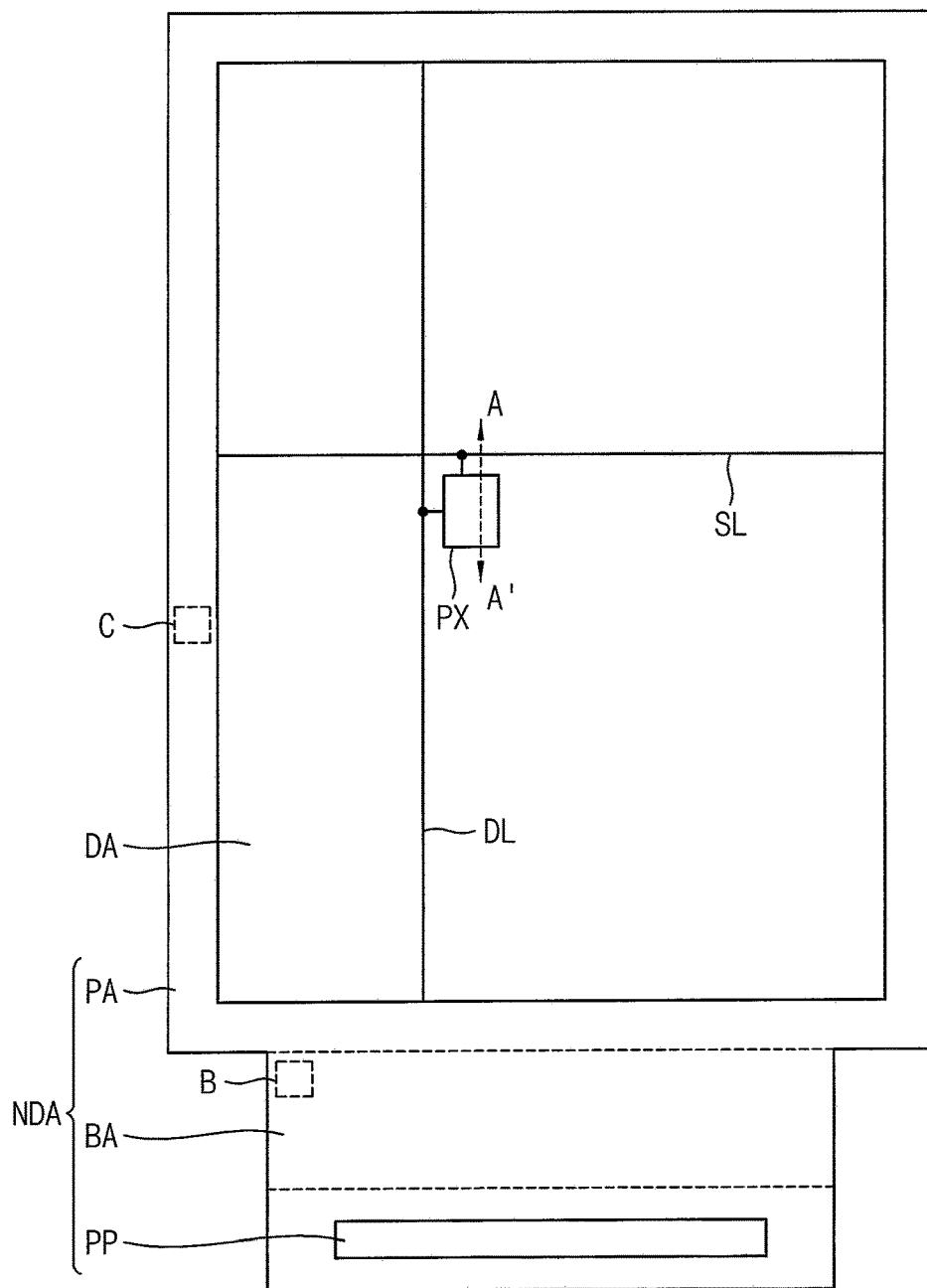
FIG. 1 is a plan view of a display device according to an exemplary embodiment of the present inventive concepts.

FIG. 1 is a plan view illustrating a display device according to an exemplary embodiment of the present inventive concepts.

Referring to FIG. 1, a display device according to an exemplary embodiment of the present inventive concepts may include a display area DA and a non-display area NDA. As shown in the exemplary embodiment of FIG. 1, the non-display area NDA is outside the display area DA by surrounding the display area DA in a first direction DR1 and a second direction DR2 that are parallel to an upper surface of a substrate 110 (see FIG. 3). However, exemplary embodiments of the present inventive concepts are not limited thereto and the positioning between the display area DA and the non-display area NDA that is spaced apart from the display area DA may vary.

As shown in the exemplary embodiment of FIG. 1, a plurality of pixels PX may be disposed in the display area DA. While the exemplary embodiment of FIG. 1 illustrates only a single pixel PX for convenience of explanation, the display area DA includes a plurality of pixels PX. Each of the pixels PX may include a transistor and a light emitting element electrically connected to the transistor. Each of the pixels PX may emit light generated from the light emitting element. The display device may display an image formed by the light in the display area DA. Each pixel PX may be connected to a scan line SL providing a scan signal to the pixel PX and a data line DL providing a data signal to the pixel PX. The scan line SL may extend in the first direction DR1 parallel to a pixel row, and the data line DL may extend in the second direction DR2 parallel to a pixel column and which is perpendicular to the first direction DR1.

The non-display area NDA may not display an image. As shown in the exemplary embodiment of FIG. 1, the non-display area NDA may include a peripheral area PA, a bending area BA, and a pad portion PP. The peripheral area PA may surround the display area DA (e.g., in the first direction DR1 and second direction DR2). At least one scan driver generating the scan signal or the like may be disposed in the peripheral area PA.

The bending area BA may be positioned at a side of the display area DA. In an exemplary embodiment, the bending area BA may be positioned adjacent to a side of the display area DA with the peripheral area PA therebetween. For example, as shown in the exemplary embodiment of FIG. 1, the bending area BA may be positioned adjacent to a bottom side of the peripheral area PA. However, exemplary embodiments of the present inventive concepts are not limited thereto. Wirings connecting the display area DA and the pad portion PP or the like may be disposed in the bending area BA.

The pad portion PP may be spaced apart from the display area DA with the bending area BA therebetween. For example, as shown in the exemplary embodiment of FIG. 1, the pad portion PP may be spaced apart from the display area DA in the second direction DR2 and may be adjacent to the bending area BA in the second direction DR2. However, exemplary embodiments of the present inventive concepts are not limited thereto. In an exemplary embodiment, the pad portion PP may be connected to a circuit board including a data driver generating the data signal or the like. The data signal may be transmitted to the pixels PX disposed in the display area DA through the wirings disposed in the bending area BA.

The bending area BA may be configured to be folded and/or bent. For example, the bending area BA may be bent around a bending axis. In an exemplary embodiment, the pad portion PP may be positioned on a bottom surface of the display area DA (e.g., a bottom surface opposite to a top surface where the image may be displayed) when the bending area BA is bent around the bending axis.

The display device may be exposed to various external impacts during the manufacturing process or when used by a user. In instances in which an external impact is directed on the non-display area NDA of the display device, the external impact may form a crack in the non-display area NDA that propagates to the display area DA. For example, cracks generated in insulation layers in the non-display area NDA due to an external impact may be propagated to the display area DA. To prevent propagation of the external impact of the cracks, at least one crack blocker may be disposed in the non-display area NDA. For example, the crack blocker may be disposed at a side of the bending area BA and/or in the peripheral area PA which will be discussed in detail later.

Figure 2:
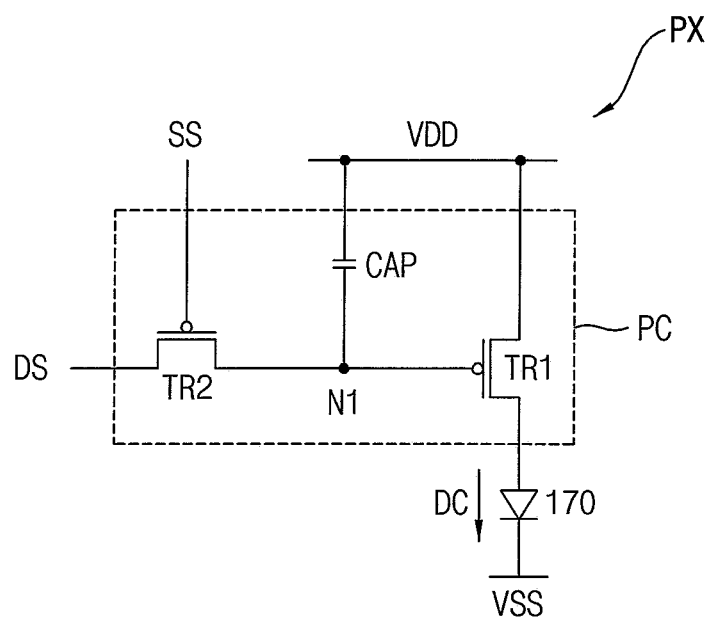
FIG. 2 is a circuit diagram of a pixel shown in FIG. 1 according to an exemplary embodiment of the present inventive concepts.

FIG. 2 is a circuit diagram illustrating an example of the pixel PX in FIG. 1 according to an exemplary embodiment of the present inventive concepts.

Referring to the exemplary embodiment of FIG. 2, each of the pixels PX may include a pixel circuit PC and a light emitting element 170 connected to the pixel circuit PC. The pixel circuit PC may receive a scan signal SS, a data signal DS, and a first voltage VDD to generate a driving current DC. The light emitting element 170 may receive a second voltage VSS, and may emit light based on the driving current DC provided from the pixel circuit PC. The pixel circuit PC may include at least one transistor and at least one capacitor for generating the driving current DC.

In an exemplary embodiment, the pixel circuit PC may include a first transistor TR1, a second transistor TR2, and a capacitor CAP. However, exemplary embodiments of the present inventive concepts are not limited thereto. For example, in another exemplary embodiment, the pixel circuit PC may include three or more transistors and/or two or more capacitors. Further, while the exemplary embodiment of the present inventive concepts shows the first transistor TR1 and the second transistor TR2 as having control electrodes that are single gate electrodes, in another exemplary embodiment, at least one of the control electrodes of the first transistor TR1 and the second transistor TR2 may be dual gate electrodes, etc.

A control electrode (e.g., a gate electrode) of the first transistor TR1 may be connected to the first node N1. The first voltage VDD may be applied to an input electrode of the first transistor TR1, and an output electrode of the first transistor TR1 may be connected to the light emitting element 170. The first transistor TR1 may generate the driving current DC based on a voltage between the control electrode and the input electrode, and may transmit the driving current DC to the light emitting element 170.

The scan signal SS may be applied to a control electrode (e.g., a gate electrode) of the second transistor TR2. The data signal DS may be applied to an input electrode of the second transistor TR2, and an output electrode of the second transistor TR2 may be connected to the first node N1. The second transistor TR2 may transmit the data signal DS to the first node N1 based on the scan signal SS.

The first voltage VDD may be applied to a first electrode of the capacitor CAP, and a second electrode of the capacitor CAP may be connected to the first node N1. The capacitor CAP may maintain the voltage between the control electrode and the input electrode of the first transistor TR1 when the second transistor TR2 is turned off. Therefore, the light emitting element 170 may emit light.

A first electrode of the light emitting element 170 may be connected to the pixel circuit PC, and the second voltage VSS may be applied to a second electrode of the light emitting element 170. In an exemplary embodiment, the second voltage VSS may be less than the first voltage VDD. The light emitting element 170 may emit light based on the driving current DC transmitted from the pixel circuit PC.

Figure 3:
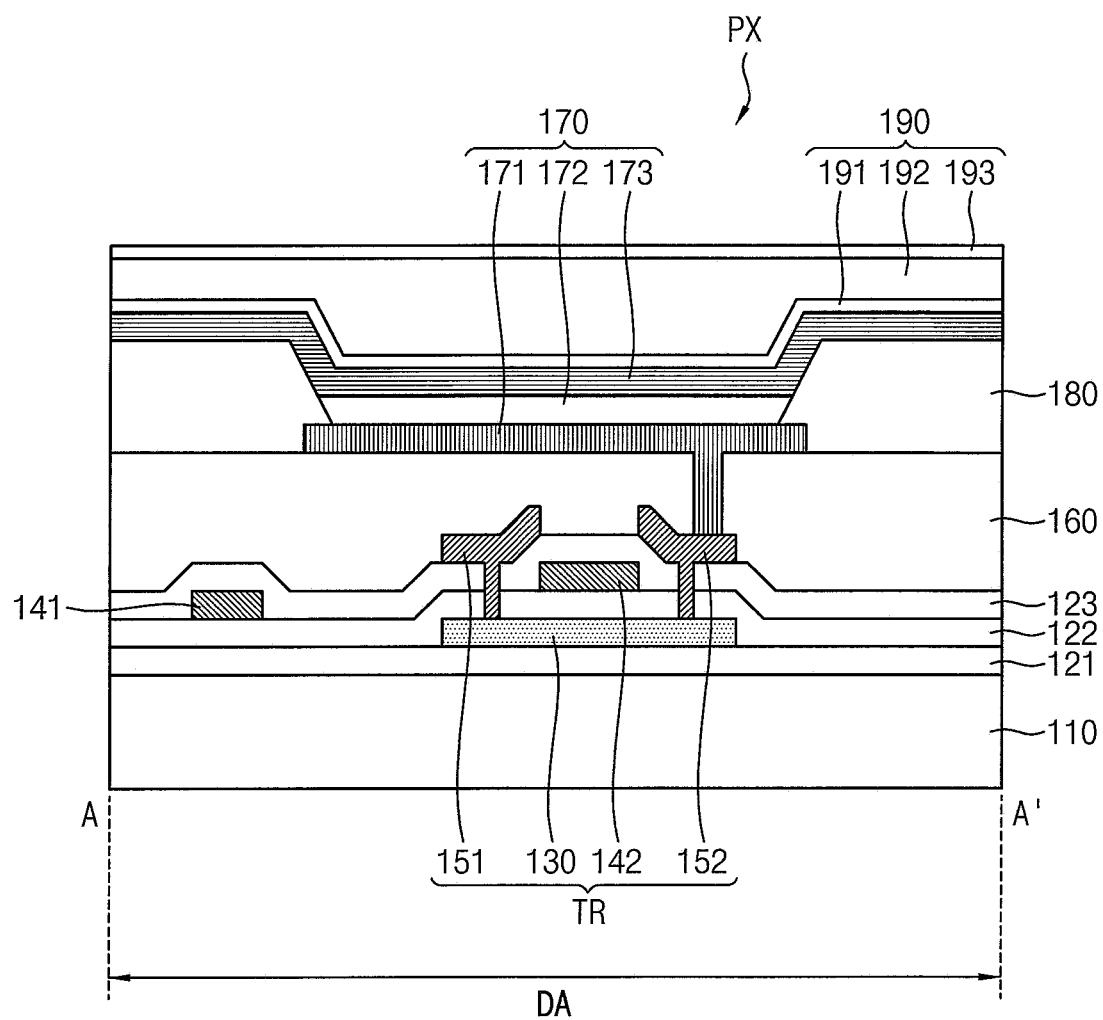
FIG. 3 is a cross-sectional view of a display device taken along line A-A' of FIG. 1 according to an exemplary embodiment of the present inventive concepts.
Figure 3:
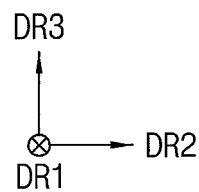

FIG. 3 is a cross-sectional view taken along a line A-A' of FIG. 1 according to an exemplary embodiment of the present inventive concepts. For example, FIG. 3 may illustrate the pixel PX shown in the circuit diagram of FIG. 2.

Referring to FIG. 3, a pixel PX according to an exemplary embodiment of the present inventive concepts may include a transistor TR disposed on a substrate 110 and the light emitting element 170 electrically connected to the transistor TR. In an exemplary embodiment, the transistor TR shown in FIG. 3 may be the first transistor TR1 shown in FIG. 2. The transistor TR may include an active layer 130, a control electrode 142, an input electrode 151, and an output electrode 152. The light emitting element 170 may include a first electrode 171, an emission layer 172, and a second electrode 173.

In an exemplary embodiment, the substrate 110 may be a transparent insulating substrate including at least one material selected from glass, quartz, plastic, and the like. In an exemplary embodiment, the substrate 110 may include a first plastic layer, a first barrier layer disposed on the first plastic layer, a second plastic layer disposed on the first barrier layer, and a second barrier layer disposed on the second plastic layer. The first plastic layer and the second plastic layer may include an organic insulation material such as polyimide (PI) or the like. The first barrier layer and the second barrier layer may include at least one material selected from an inorganic insulation material such as silicon oxide, silicon nitride, amorphous silicon, and the like. For example, the first barrier layer may have a multilayer structure including an amorphous silicon layer and a silicon oxide layer disposed on the amorphous silicon layer, and the second barrier layer may have a single-layer structure including a silicon oxide layer.

A buffer layer 121 may be disposed on the substrate 110. The buffer layer 121 may be disposed between the substrate 110 and the active layer 130. For example, as shown in the exemplary embodiment of FIG. 3, a lower surface of the buffer layer 121 may directly contact an upper surface of the substrate 110 and an upper surface of the buffer layer 121 may directly contact a lower surface of the active layer 130. The buffer layer 121 may block impurities from being permeated toward the active layer 130 through the substrate 110. The buffer layer 121 may also provide a planarized upper surface above the substrate 110. In an exemplary embodiment, the buffer layer 121 may include an inorganic insulation material such as at least one compound selected from silicon oxide, silicon nitride, silicon oxynitride, and the like. However, exemplary embodiments of the present inventive concepts are not limited thereto.

The active layer 130 may be disposed on the buffer layer 121. In an exemplary embodiment, the active layer 130 may include at least one compound selected from amorphous silicon, polycrystalline silicon, and the like. In another exemplary embodiment, the active layer 130 may include an oxide semiconductor. The active layer 130 may include a source region, a drain region, and a channel region disposed between the source region and the drain region. For example, the source region, drain region and channel regions may be spaced apart in the second direction DR2. The source region and the drain region may be doped with P-type or N-type impurities.

A first insulation layer 122 covering the active layer 130 may be disposed on the buffer layer 121. The first insulation layer 122 may be disposed between the active layer 130 and the control electrode 142 to insulate the control electrode 142 from the active layer 130. For example, as shown in the exemplary embodiment of FIG. 3, a lower surface of the first insulation layer 122 may directly contact an upper surface of the active layer 130 and an upper surface of the first insulation layer 122 may directly contact a lower surface of the control electrode 142. In an exemplary embodiment, the first insulation layer 122 may include an inorganic insulation material such as at least one compound selected from silicon oxide, silicon nitride, silicon oxynitride, and the like.

A scan line 141 and the control electrode 142 may be disposed on the first insulation layer 122. The control electrode 142 may be spaced apart from the scan line 141 (e.g., in the second direction DR2). The control electrode 142 may be insulated from the active layer 130, and may overlap the active layer 130 (e.g., in a third direction DR3 that is parallel to a thickness direction of the substrate 110 and is perpendicular to the first direction DR1 and the second direction DR2). For example, the control electrode 142 may overlap the channel region of the active layer 130. In an exemplary embodiment, the scan line 141 and the control electrode 142 may include a conductive material such as at least one compound selected from molybdenum (Mo), copper (Cu), and the like.

As shown in the exemplary embodiment of FIG. 3, a second insulation layer 123 covering the scan line 141 and the control electrode 142 may be disposed on the first insulation layer 122. The second insulation layer 123 may be disposed between the control electrode 142 and the input electrode 151 and between the control electrode 142 and the output electrode 152 to insulate the input electrode 151 and the output electrode 152 from the control electrode 142. For example, as shown in the exemplary embodiment of FIG. 3, a lower surface of the second insulation layer 123 may directly contact upper surfaces of the scan line 141 and the control electrode 142 and an upper surface of the second insulation layer 123 may directly contact lower surfaces of the input electrode 151 and the output electrode 152. In an exemplary embodiment, the second insulation layer 123 may include an inorganic insulation material such as at least one compound selected from silicon oxide, silicon nitride, silicon oxynitride, and the like.

The input electrode 151 and the output electrode 152 may be disposed on the second insulation layer 123. The input electrode 151 may be insulated from the control electrode 142, and may be connected to a first side of the active layer 130. For example, the input electrode 151 may be connected to the source region of the active layer 130 through a contact hole formed in the first insulation layer 122 and the second insulation layer 123. The output electrode 152 may be insulated from the control electrode 142, and may be connected to a second side of the active layer 130. For example, the output electrode 152 may be connected to the drain region of the active layer 130 through a contact hole formed in the first insulation layer 122 and the second insulation layer 123. In an exemplary embodiment, the input electrode 151 and the output electrode 152 may include a conductive material such as at least one compound selected from aluminum (Al), titanium (Ti), copper (Cu), and the like. For example, in an exemplary embodiment, the input electrode 151 and the output electrode 152 may have a multilayer structure including a titanium layer, an aluminum layer, and a titanium layer which are stacked (e.g., in the third direction DR3).

A planarization layer 160 covering the input electrode 151 and the output electrode 152 may be disposed on the second insulation layer 123. The planarization layer 160 may provide an upper planarized surface over the input electrode 151 and the output electrode 152. For example, as shown in the exemplary embodiment of FIG. 3, the planarization layer 160 may directly contact an upper surface of the second insulation layer 123 and upper surfaces and side surfaces of the input electrode 151 and the output electrode 152. In an exemplary embodiment, the planarization layer 160 may include an organic insulation material such as polyimide (PI) or the like. However, exemplary embodiments of the present inventive concepts are not limited thereto.

The first electrode 171 may be disposed on the planarization layer 160. For example, as shown in the exemplary embodiment of FIG. 3, a lower surface of the first electrode 171 may directly contact an upper surface of the planarization layer 160. The first electrode 171 may be connected to the transistor TR. For example, as shown in the exemplary embodiment of FIG. 3, the first electrode 171 may be connected to the output electrode 152 of the transistor TR through a contact hole formed in the planarization layer 160. In an exemplary embodiment, the first electrode 171 may include a conductive material such as at least one compound selected from metal, alloy, transparent conductive oxide, and the like. For example, the first electrode 171 may include at least one compound selected from silver (Ag), indium tin oxide (ITO), and the like. For example, in an exemplary embodiment, the first electrode 171 may have a multilayer structure including an indium tin oxide layer, a silver layer, and an indium tin oxide layer which are stacked (e.g., in the third direction DR3).

A pixel defining layer 180 covering the first electrode 171 may be disposed on the planarization layer 160. For example, as shown in the exemplary embodiment of FIG. 3, a lower surface of the pixel defining layer 180 may directly contact upper surfaces of the planarization layer 160 and upper surfaces and side surfaces of lateral ends of the first electrode 171. The pixel defining layer 180 may have a pixel opening that exposes at least a portion of the first electrode 171. For example, as shown in the exemplary embodiment of FIG. 3, the pixel opening may expose a central portion of the first electrode 171, and the pixel defining layer 180 may cover a peripheral portion of the first electrode 171, such as the upper surfaces and side surfaces of the lateral ends of the first electrode 171. In an exemplary embodiment, the pixel defining layer 180 may include an organic insulation material such as polyimide (PI) or the like. However, exemplary embodiments of the present inventive concepts are not limited thereto.

The emission layer 172 may be disposed on the first electrode 171 exposed by the pixel opening. The emission layer 172 may be disposed between the first electrode 171 and the second electrode 173. For example, as shown in the exemplary embodiment of FIG. 3, a lower surface of the emission layer 172 may directly contact an upper surface of the first electrode and the upper surface of the emission layer 172 may directly contact a lower surface of the second electrode 173. The lateral side surfaces of the emission layer 172 may directly contact the pixel defining layer 180. In an exemplary embodiment, the emission layer 172 may include at least one material selected from an organic light emitting material and a quantum dot. However, exemplary embodiments of the present inventive concepts are not limited thereto.

In an exemplary embodiment, the organic light emitting material may include a low molecular organic compound or a high molecular organic compound. For example, the low molecular organic compound may include at least one compound selected from copper phthalocyanine, diphenylbenzidine (N,N'-diphenylbenzidine), trihydroxyquinoline aluminum (tris-(8-hydroxyquinoline)aluminum), and the like. The high molecular organic compound may include at least one compound selected from poly ethylenedioxythiophene (poly(3,4-ethylenedioxythiophene), polyaniline, polyphenylenevinylene, polyfluorene, and the like.

In an exemplary embodiment, the quantum dot may include a core including a group II-VI compound, a group III-V compound, a group IV-VI compound, a group IV element, a group IV compound, and a combination thereof. In an exemplary embodiment, the quantum dot may have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second electrode 173 may be disposed on the emission layer 172. For example, as shown in the exemplary embodiment of FIG. 3, a lower surface of the second electrode 173 may directly contact an upper surface of the emission layer 172 and surfaces of the pixel defining layer 180. The second electrode 173 may be spaced apart from the first electrode 171 by the emission layer 172, and may overlap the first electrode 171 (e.g., in the third direction DR3). As shown in the exemplary embodiment of FIG. 3, the second electrode 173 may also be disposed on the pixel defining layer 180. The second electrode 173 may include a conductive material such as at least one material selected from metal, alloy, transparent conductive oxide, and the like. For example, the second electrode 173 may include at least one compound selected from aluminum (Al), platinum (Pt), silver (Ag), magnesium (Mg), gold (Au), chromium (Cr), tungsten (W), titanium (Ti), and the like.

An encapsulation layer 190 may be disposed on the pixel PX in the display area DA. The encapsulation layer 190 may cover the light emitting element 170 to protect the light emitting element 170 from impurities such as oxygen, moisture, or the like. In an exemplary embodiment, the encapsulation layer 190 may include at least one inorganic encapsulation layer and at least one organic encapsulation layer. In an exemplary embodiment, the inorganic encapsulation layer may include at least one compound selected from silicon nitride, silicon oxynitride and the like, and the organic encapsulation layer may include at least one material selected from epoxy-based resin, acryl-based resin, polyimide-based resin and the like.

As shown in the exemplary embodiment of FIG. 3, the encapsulation layer 190 may include a first inorganic encapsulation layer 191 disposed on the second electrode 173, an organic encapsulation layer 192 disposed on the first inorganic encapsulation layer 191, and a second inorganic encapsulation layer 193 disposed on the organic encapsulation layer 192. For example, the first inorganic encapsulation layer 191, the organic encapsulation layer 192 and the second inorganic encapsulation layer 193 may be consecutively stacked (e.g., in the third direction DR3). However, exemplary embodiments of the present inventive concepts are not limited thereto.

Figure 4:
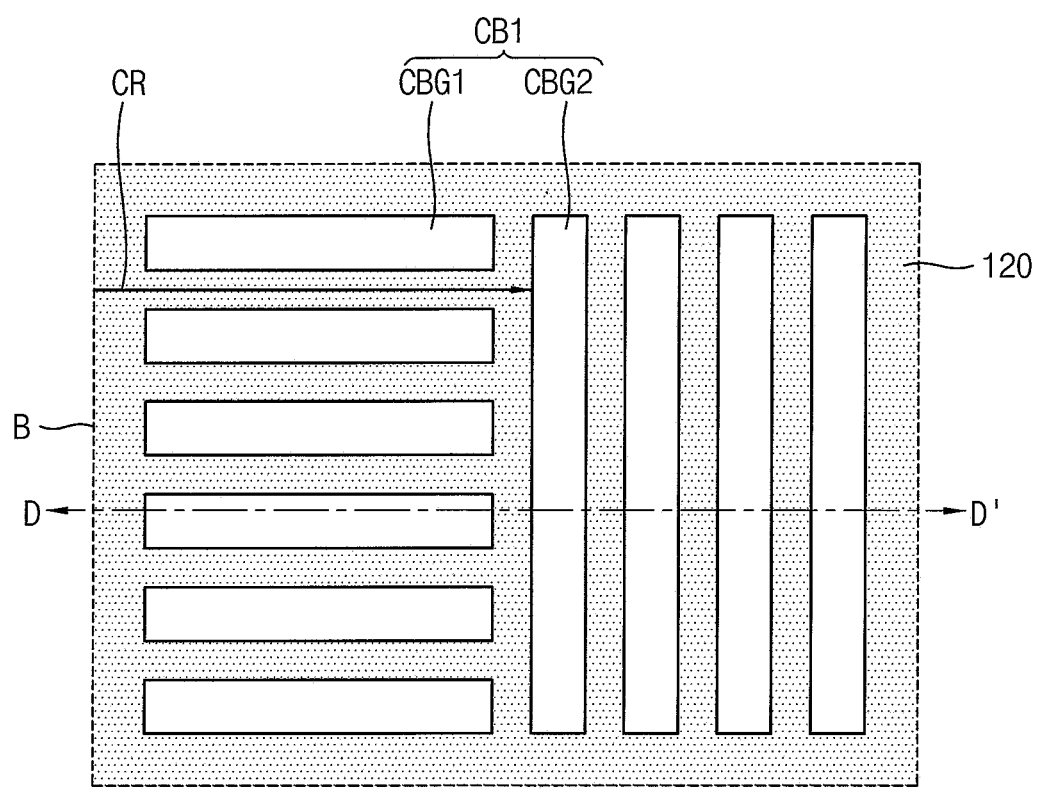
FIG. 4 is a plan view of a display device showing area B of FIG. 1 according to an exemplary embodiment of the present inventive concepts.
Figure 4:
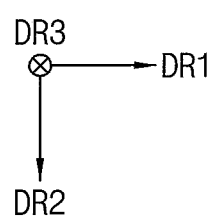
Figure 5:
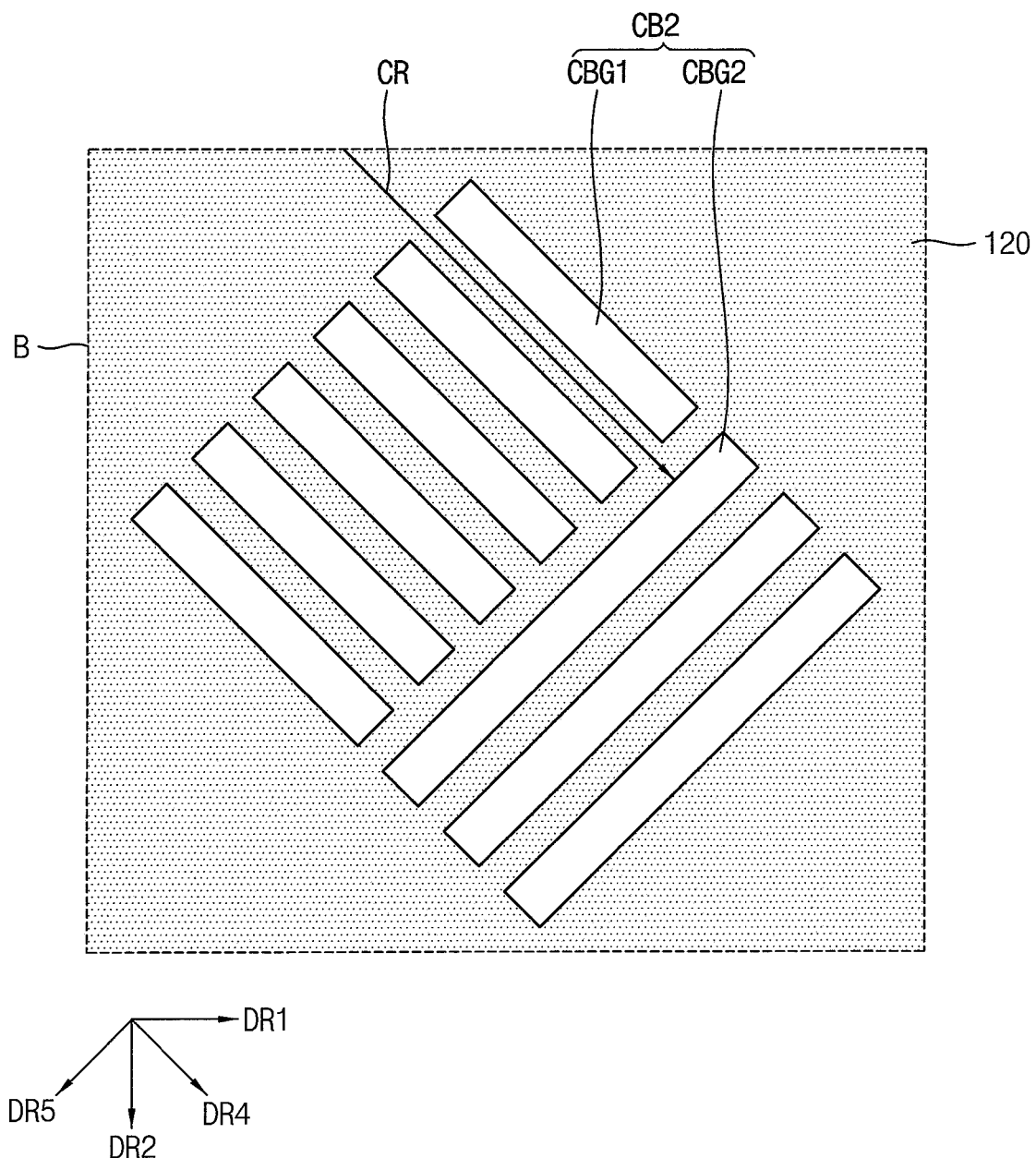
FIG. 5 is a plan view of a display device showing area B of FIG. 1 according to an exemplary embodiment of the present inventive concepts.
Figure 6:
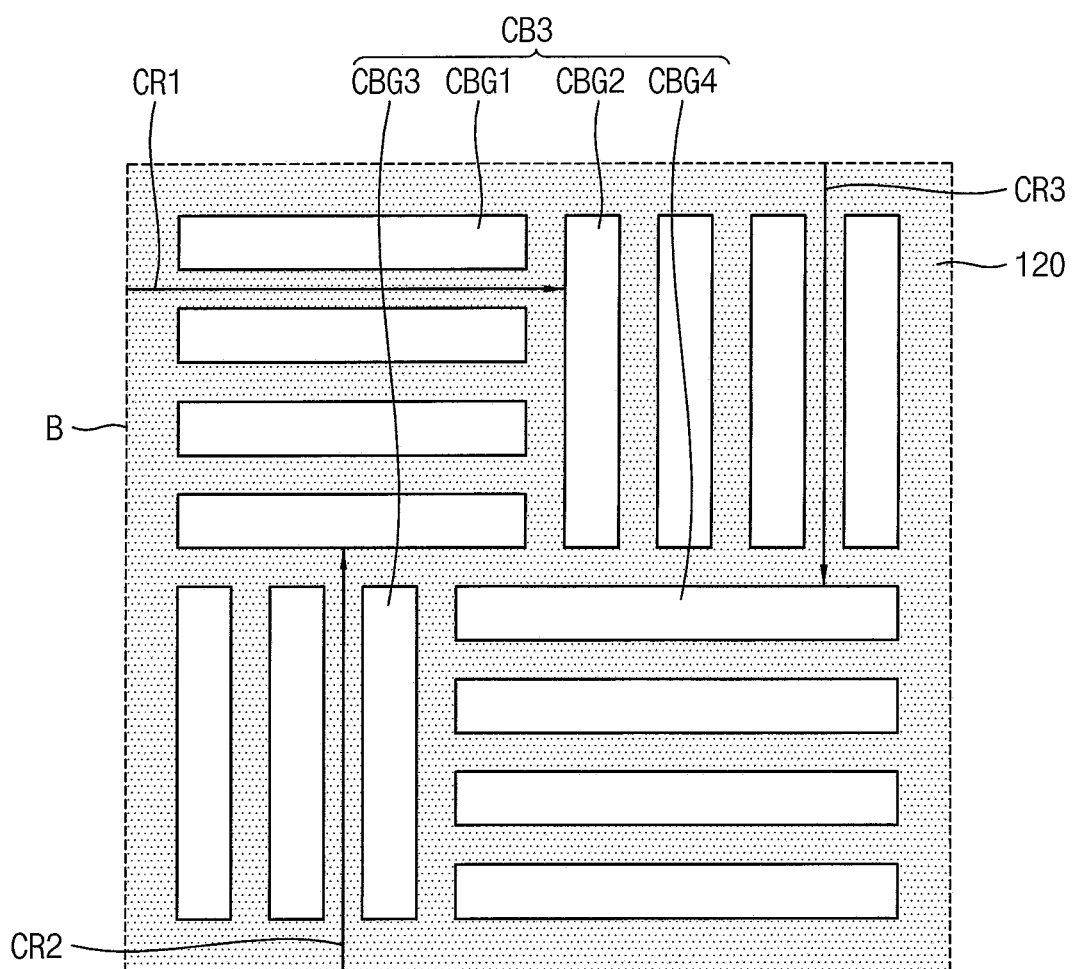
FIG. 6 is a plan view of a display device showing area B of FIG. 1 according to an exemplary embodiment of the present inventive concepts.
Figure 6:
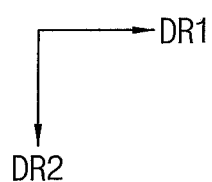
Figure 7:
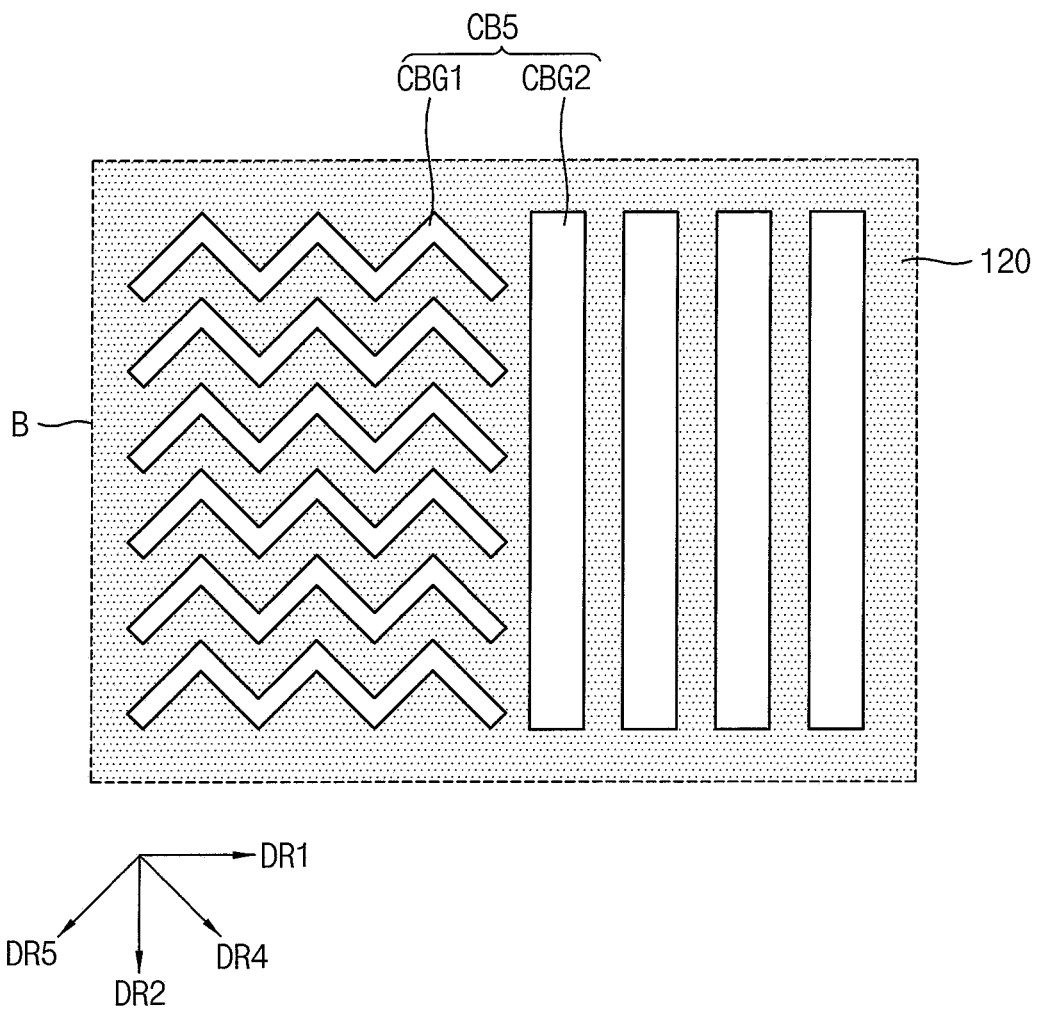
FIG. 7 is a plan view of a display device showing area B of FIG. 1 according to an exemplary embodiment of the present inventive concepts.
Figure 8:
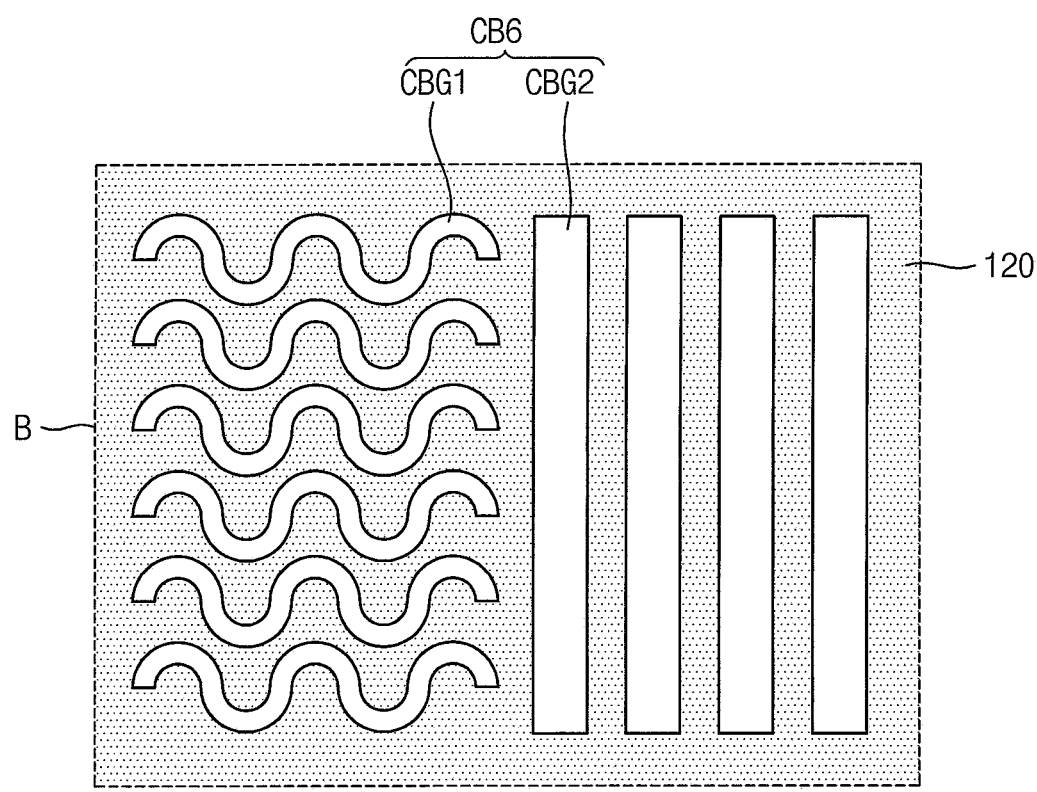
FIG. 8 is a plan view of a display device showing area B of FIG. 1 according to an exemplary embodiment of the present inventive concepts.

FIG. 4 is a plan view of a display device showing area B of FIG. 1 according to an exemplary embodiment of the present inventive concepts. FIG. 5 is a plan view of a display device showing area B of FIG. 1 according to another exemplary embodiment of the present inventive concepts. FIG. 6 is a plan view of a display device showing area B of FIG. 1 according to another exemplary embodiment of the present inventive concepts. FIG. 7 is a plan view of a display device showing area B of FIG. 1 according to another exemplary embodiment of the present inventive concepts. FIG. 8 is a plan view of a display device showing area B of FIG. 1 according to another exemplary embodiment of the present inventive concepts. For example, the area B in FIG. 1 may illustrate a left side of the bending area BA.

Referring to FIGS. 1 and 4, a crack blocker CB1 according to an exemplary embodiment of the present inventive concepts may be positioned on a side of the bending area BA, and may include a plurality of first crack block grooves CBG1 and a plurality of second crack block grooves CBG2 defined in a plurality of insulation layers 120. The crack block grooves may be areas of empty space defined in the insulation layers 120 which prevent the propagation of a crack CR across the empty space of the crack block grooves. As will be described later, in exemplary embodiments of the present inventive concepts, the crack block grooves may remain unfilled or may be filled (e.g., by an inorganic encapsulation layer). Each of the first crack block grooves CBG1 may extend in the first direction DR1, and the first crack block grooves CBG1 may be arranged (e.g., spaced apart) in the a second direction DR2. Each of the second crack block grooves CBG2 may extend in the second direction DR2, and the second crack block grooves CBG2 may be arranged (e.g., spaced apart) in the first direction DR1. As shown in the exemplary embodiment of FIG. 4, the second direction DR2 may be substantially perpendicular to the first direction DR1. In other words, the second direction DR2 may form an angle of about 90 degrees with the first direction DR1. However, exemplary embodiments of the present inventive concepts are not limited thereto and in other exemplary embodiments, and in other exemplary embodiments, the first crack block grooves CBG1 and the second crack block grooves CBG2 may extend and be arranged with respect to directions that are oblique with respect to each other.

The plurality of second crack block grooves CBG2 may be adjacent to the plurality of first crack block grooves CBG1. For example, as shown in the exemplary embodiment of FIG. 4, the plurality of second crack block grooves CBG2 may be adjacent to the plurality of first crack block grooves CBG1 in the first direction DR1. For example, each of the first crack block grooves CBG1 may disposed outside the second crack block grooves CBG2 and are spaced apart from the second crack block grooves CBG2 in the first direction DR1.

In an exemplary embodiment, the first crack block grooves CBG1 and the second crack block grooves CBG2 may have a stripe shape in a plan view (e.g., in a plane defined by the first direction DR1 and the second direction DR2). As shown in the exemplary embodiment of FIG. 4, lengths in the first direction DR1 of each of the first crack block grooves CBG1 may be substantially equal to each other, and a gap between adjacent first crack block grooves CBG1 in the second direction DR2 may be substantially equal. However, exemplary embodiments of the present inventive concepts are not limited thereto and the lengths and/or gaps of at least one of the first crack block grooves CBG1 may differ from those of other first crack block grooves CBG1. The lengths in the second direction DR2 of the second crack block grooves CBG2 may be substantially equal to each other, and a gap between adjacent second crack block grooves CBG2 in the first direction DR1 may be substantially equal. However, exemplary embodiments of the present inventive concepts are not limited thereto and the lengths and/or gaps of at least one of the second crack block grooves CBG2 may differ from those of other second crack block grooves CBG2. As shown in the exemplary embodiment of FIG. 4, the distance that the first crack block grooves CBG1 are spaced apart from the second crack block grooves CBG2 in the first direction DR1 may be substantially equal to the length of the gap between adjacent second crack block grooves CBG2 in the first direction DR1. However, exemplary embodiments of the present inventive concepts are not limited thereto.

In an exemplary embodiment, the crack blocker CB1 may have a rectangular shape in a plan view (e.g., in a plane defined by the first direction DR1 and the second direction DR2). For example, the sum of the widths in the second direction DR2 of the first crack block grooves CBG1 and gaps in the second direction DR2 of adjacent first crack block grooves CBG1 may be substantially equal to a length in the second direction DR2 of each of the second crack block grooves CBG2. Therefore, the distance that the first crack block grooves CBG1 are spaced apart from the second crack block grooves CBG2 (e.g., in the first direction DR1) provides a rectangular shape for the crack blocker CB1. However, exemplary embodiments of the present inventive concepts are not limited thereto. For example, in other exemplary embodiments, the crack blocker CB1 may have a square shape, another polygonal shape, etc.

For example, in an alternative exemplary embodiment that differs from the exemplary embodiment of FIG. 4, each of the second crack block grooves CBG2 may extend longer in the second direction DR2 along a side of the bending area BA than the widths of the first crack block grooves CBG1 and gaps therebetween. For example, a length in the second direction DR2 of each of the second crack block grooves CBG2 may be greater than the sum of widths in the second direction DR2 of the first crack block grooves the first crack block grooves CBG1 and gaps in the second direction DR2 between the adjacent first crack block grooves CBG1.

As shown in the exemplary embodiment of FIG. 1, the first direction DR1 may be parallel to the scan line SL, and the second direction DR2 may be parallel to the data line DL. For example, the first direction DR1 in which each of the first crack block grooves CBG1 extends may be substantially parallel to the pixel row, and the second direction DR2 in which each of the second crack block grooves CBG2 extends may be substantially parallel to the pixel column.

As shown in the exemplary embodiment of FIG. 4, cracks CR may be propagated along the insulation layers 120 when the cracks CR are generated at an edge of the bending area BA by an external impact. However, in an exemplary embodiment of the present inventive concepts, when cracks CR are propagated in the first direction DR1 parallel to the scan line SL and extend between a gap between adjacent first crack block grooves CBG1, the cracks CR may be blocked by the second crack block grooves CBG2 extending in the second direction DR2 that crosses the first direction DR1. For example, as shown in the exemplary embodiment of FIG. 4, the crack CR in the insulation layers 120 extends from an edge of region B in the first direction DR1 through a gap between adjacent first crack block grooves CBG1 and the distance that the plurality of first crack block grooves CBG1 is spaced apart from the plurality of second crack block grooves CBG2. The crack CR terminates at the second crack block groove CBG2 immediately adjacent (e.g., in the first direction DR1) to the plurality of first crack block grooves CBG1. Accordingly, the crack blocker CB1 may prevent the propagation of the cracks CR past the crack blocker CB1 and the crack CR may not extend to the display area DA.

Referring to FIGS. 1 and 5, a crack blocker CB2 according to an exemplary embodiment of the present inventive concepts may be positioned on a side of the bending area BA, and may include a plurality of first crack block grooves CBG1 and a plurality of second crack block grooves CBG2 defined in a plurality of insulation layers 120. Each of the first crack block grooves CBG1 may extend in a fourth direction DR4, and the first crack block grooves CBG1 may be arranged in a fifth direction DR5 that crosses the first direction DR1. For example, as shown in the exemplary embodiment of FIG. 5, the fifth direction DR5 may be substantially perpendicular to the fourth direction DR4. Each of the second crack block grooves CBG2 may extend in the fifth direction DR5, and the second crack block grooves CBG2 may be arranged in the fourth direction DR4. The first crack block grooves CBG1 may be spaced apart from the second crack block grooves CBG2 in the fourth direction DR4. As shown in the exemplary embodiment of FIG. 5, the distance between the first crack block grooves CBG1 and the second crack block grooves CBG2 in the fourth direction DR4 may be approximately the same as each of the gaps between adjacent second crack block grooves CBG2 in the fourth direction DR4. However, exemplary embodiments of the present inventive concepts are not limited thereto. Descriptions of elements of the crack blocker CB2 described with reference to FIG. 5, which substantially the same as or similar to those of the crack blocker CB1 described with reference to FIG. 4, will not be repeated.

The fourth direction DR4 may form an acute angle with the scan line SL, and the fifth direction DR5 may form an acute angle with the data line DL. For example, the fourth direction DR4 in which each of the first crack block grooves CBG1 extends may form an acute angle in a clockwise direction with the first direction DR1 in which the scan line SL extends as shown in FIG. 1. The fifth direction DR5 in which each of the second crack block grooves CBG2 extends may form an acute angle in a clockwise direction with the second direction DR2 in which the data line DL extends as shown in FIG. 1. As shown in the exemplary embodiment of FIG. 5, an angle formed by the fourth direction DR4 with the first direction DR1 may be about 45 degrees, and an angle formed by the fifth direction DR5 and the second direction DR2 may be about 45 degrees.

Cracks CR may be propagated along the insulation layers 120 when the cracks CR are generated at an edge of the bending area BA by an external impact. However, in the exemplary embodiment of FIG. 5, when cracks CR are propagated in the fourth direction DR4 forming an acute angle with the scan line SL, the cracks CR may be blocked by the second crack block grooves CBG2 extending in the fifth direction DR5 crossing the fourth direction DR4. For example, as shown in the exemplary embodiment of FIG. 5, the crack in the insulation layers 120 extends from an edge of region B in the fourth direction DR4 through a gap between adjacent first crack block grooves CBG1 and a distance that the plurality of first crack block grooves CBG1 and the plurality of second crack block grooves CBG2 are spaced apart. The crack CR terminates at the second crack block groove CBG2 immediately adjacent (e.g., in the fourth direction DR4) to the plurality of first crack block grooves CBG1. Accordingly, the crack blocker CB2 may prevent the propagation of the cracks CR past the crack blocker CB2 and the cracks CR may not extend to the display area DA.

Referring to FIGS. 1 and 6, a crack blocker CB3 according to an exemplary embodiment of the present inventive concepts may be positioned on a side of the bending area BA, and may include a plurality of first crack block grooves CBG1, a plurality of second crack block grooves CBG2, a plurality of third crack block grooves CBG3, and a plurality of fourth crack block grooves CBG4 defined in a plurality of insulation layers 120. Each of the first crack block grooves CBG1 may extend in the first direction DR1, and the plurality of the first crack block grooves CBG1 may be arranged in the second direction DR2. Each of the second crack block grooves CBG2 may extend in the second direction DR2, and the plurality of second crack block grooves CBG2 may be arranged in the first direction DR1. Each of the third crack block grooves CBG3 may extend in the second direction DR2, and the plurality of third crack block grooves CBG3 may be arranged in the first direction DR1. Each of the fourth crack block grooves CBG4 may extend in the first direction DR1, and the plurality of fourth crack block grooves CBG4 may be arranged in the second direction DR2. Descriptions on elements of the crack blocker CB3 described with reference to FIG. 6, which are substantially the same as or similar to those of the crack blocker CB1 described with reference to FIG. 4, will not be repeated.

As shown in the exemplary embodiment of FIG. 6, the second crack block grooves CBG2 may be adjacent to the first crack block grooves CBG1 in the first direction DR1 and may be spaced apart from the first crack block grooves CBG1 in the first direction DR1. The third crack block grooves CBG3 may be adjacent to the first crack block grooves CBG1 in the second direction DR2 and may be spaced apart from the first crack block grooves CBG1 in the second direction DR2. The fourth crack block grooves CBG4 may be adjacent to the third crack block grooves CBG3 in the first direction DR1 and may be spaced apart from the third crack block grooves CBG3 in the first direction DR1. The fourth crack block grooves CBG4 may be adjacent to the second crack block grooves CBG2 in the second direction DR2 and may be spaced apart from the second crack block grooves CBG2 in the second direction DR2. For example, the first crack block grooves CBG1 may disposed outside the second crack block grooves CBG2, and the third crack block grooves CBG3 may disposed outside the fourth crack block grooves CBG4.

In an exemplary embodiment, the first crack block grooves CBG1, the second crack block grooves CBG2, the third crack block grooves CBG3, and the fourth crack block grooves CBG4 may have a stripe shape in a plan view (e.g., in a plane defined by the first direction DR1 and second direction DR2). For example, lengths in the first direction DR1 of the first crack block grooves CBG1 may be substantially equal to each other, and a gap between adjacent first crack block grooves CBG1 in the second direction DR2 may be substantially equal. Lengths in the second direction DR2 of the second crack block grooves CBG2 may be substantially equal to each other, and a gap between adjacent second crack block grooves CBG2 in the first direction DR1 may be substantially equal. Lengths in the second direction DR2 of the third crack block grooves CBG3 may be substantially equal to each other, and a gap between adjacent third crack block grooves CBG3 in the first direction DR1 may be substantially equal. Lengths in the first direction DR1 of the fourth crack block grooves CBG4 may be substantially equal to each other, and a gap between adjacent fourth crack block grooves CBG4 in the second direction DR2 may be substantially equal. However, exemplary embodiments of the present inventive concepts are not limited thereto.

As shown in the exemplary embodiment of FIG. 6, the crack blocker CB3 may be substantially square-shaped in a plan view (e.g., in a plane defined in the first direction DR1 and second direction DR2). For example, the sum of widths in the second direction DR2 of the fourth crack block grooves CBG4 and gaps in the second direction DR2 of adjacent fourth crack block grooves CBG4 plus the length in the second direction DR2 of each of the second crack block grooves CBG2 and the distance in the second direction DR2 between the plurality of second crack block grooves CBG2 and fourth crack block grooves CBG4 may equal a first sum. The sum of the length in the second direction DR2 of each of the third crack block grooves CBG3 plus the widths in the first direction of each of the first crack block grooves CGB1 and gaps in the first direction DR1 between adjacent first block grooves CGB1 and the distance in the first direction between the plurality of first crack block grooves CBG1 and the plurality of third crack block grooves CBG3 may be substantially equal the first sum. Further, the sum of a length in the first direction DR1 of each of the first crack block grooves CBG1 plus the widths in the first direction DR1 of the second crack block grooves CBG2, the gaps in the first direction DR1 between adjacent second crack block grooves CBG2 and the distance in the first direction DR1 between the plurality of first crack block grooves CBG1 and the plurality of second crack block grooves CBG2 may be substantially equal to the first sum. The sum of widths in the first direction DR1 of the third crack block grooves CBG3, gaps in the first direction DR1 between adjacent third crack block grooves CBG3 plus a length in the first direction DR1 of each of the fourth crack block grooves CBG4 and the length in the first direction DR1 of the distance between the plurality of third crack block grooves CBG3 and the plurality of fourth crack block grooves CBG4 may be substantially equal to the first sum. However, exemplary embodiments of the present inventive concepts are not limited thereto and in another exemplary embodiment, the crack blocker CB3 may be rectangular shaped.

Cracks CR1, CR2, and CR3 may be propagated along the insulation layers 120 when the cracks CR1, CR2, and CR3 are generated at an edge of the bending area BA by external impact. However, in the exemplary embodiment of FIG. 6, when cracks CR1 are propagated in the first direction DR1 parallel to the scan line SL and pass through a gap between adjacent first crack blocking grooves CBG1, the cracks CR1 may be blocked by the second crack block grooves CBG2 extending in the second direction DR2 crossing the first direction DR1. Further, when cracks CR2 and CR3 are propagated in the second direction DR2 parallel to the data line DL and pass gaps between adjacent second crack blocking grooves CBG2 and adjacent third crack blocking grooves CBG3, respectively, the cracks CR2 and CR3 may be blocked by the first crack block grooves CBG1 and/or the fourth crack block grooves CBG4 extending in the first direction DR1 crossing the second direction DR2. Accordingly, the crack blocker CB3 may prevent the further propagation of the cracks CR1, CR2, and CR3 to the display area DA.

Furthermore, as shown in the exemplary embodiment of FIG. 6, the first crack block grooves CBG1 and the fourth crack block grooves CBG4 may have lengths extending in the first direction DR1 such that lateral ends of the first crack block grooves CBG1 and the fourth crack blocking grooves CBG4 overlap each other in the second direction DR2. Therefore, a crack extending in the second direction DR2 in the space between the plurality of first crack blocking gaps CBG1 and the plurality of second crack block gaps CBG2 may be prevented from further propagation by the fourth crack block gap CBG4. Likewise, a crack extending in the second direction DR2 in the gap between the third crack block gaps CBG3 and the fourth crack block gaps CBG4 may be prevented from further propagation by the first crack block gaps CBG1. However, exemplary embodiments of the present inventive concepts are not limited thereto. For example, in another exemplary embodiment, the lengths of the second crack block gap CBG2 and the third crack block gap CBG3 in the second direction DR2 may extend so that the second crack block gap CBG2 and third crack block gap CBG3 may overlap each other in the first direction DR1 to prevent cracks from further propagating in the spaces between the first crack blocking gap CBG1 and the third crack blocking gap CBG3 and between the second crack block gap CBG2 and the fourth crack blocking gap CBG4.

Referring to FIGS. 1 and 7, a crack blocker CB5 according to an exemplary embodiment may be positioned on a side of the bending area BA, and may include a plurality of first crack block grooves CBG1 and a plurality of second crack block grooves CBG2 defined in a plurality of insulation layers 120. Each of the first crack block grooves CBG1 may extend in a first direction DR1, and the first crack block grooves CBG1 may be arranged in a second direction DR2 crossing the first direction DR1. Each of the second crack block grooves CBG2 may extend in the second direction DR2, and the second crack block grooves CBG2 may be arranged in the first direction DR1. At least one of the first crack block grooves CBG1 and the second crack block grooves CBG2 of the crack blocker CB5 may have a folded or zigzag shape at least once. Descriptions on elements of the crack blocker CB5 described with reference to FIG. 7, which are substantially the same as or similar to those of the crack blocker CB1 described with reference to FIG. 4, will not be repeated.

As shown in the exemplary embodiment of FIG. 7, each of the first crack block grooves CBG1 may have a folded shape at least once. For example, in the exemplary embodiment of FIG. 7, each of the first crack block grooves CBG1 may have a shape extending in the first direction DR1 and alternately folded. For example, while the first crack block grooves CBG1 may extend longitudinally in the first direction DR1, the first crack block grooves may be comprised of a plurality of segments which alternatingly extend in the fifth direction DR5 and the fourth direction DR4 to provide a zigzag or folded shape. However, exemplary embodiments of the present inventive concepts are not limited thereto, and in another exemplary embodiment, each of the second crack block grooves CBG2 may have a folded shape at least once. Furthermore, the number of alternating segments that are folded are not limited to the shape shown for the first crack block grooves CBG1 shown in FIG. 7, and the number of alternating segments, the length of the segments and the angle of the segments with respect to the first direction DR1 may vary.

Referring to FIGS. 1 and 8, a crack blocker CB6 according to an exemplary embodiment of the present inventive concepts may be positioned on a side of the bending area BA, and may include a plurality of first crack block grooves CBG1 and a plurality of second crack block grooves CBG2 defined in a plurality of insulation layers 120. Each of the first crack block grooves CBG1 may extend in the first direction DR1, and the first crack block grooves CBG1 may be arranged in the second direction DR2. Each of the second crack block grooves CBG2 may extend in the second direction DR2, and the second crack block grooves CBG2 may be arranged in the first direction DR1. At least one of the first crack block groove CBG1 and the second crack block groove CBG2 of the crack blocker CB6 may have a bent shape at least once. Descriptions on elements of the crack blocker CB6 described with reference to FIG. 8, which are substantially the same as or similar to those of the crack blocker CB1 described with reference to FIG. 4, will not be repeated.

For example, as shown in the exemplary embodiment of FIG. 8, each of the first crack block grooves CBG1 may have a bent shape at least once. For example, as illustrated in FIG. 8, each of the first crack block grooves CBG1 may have a shape that longitudinally extends in the first direction DR1 and alternatingly bends in the second direction in opposite directions to form a sinusoidal-like shape. However, exemplary embodiments of the present inventive concepts are not limited thereto, and in another exemplary embodiment, each of the second crack block grooves CBG2 may have a bent shape at least once. Furthermore, the number of alternating bends and the angles of the bends are not limited to the sinusoidal-like shape shown for the first crack block grooves CBG1 shown in FIG. 8, and the number of alternating bends and the angle of the bends may vary.

While the crack blockers CB1, CB2, CB3, CB5 and CB6 shown in the exemplary embodiments of FIGS. 4-8 have specific shapes, the numbers of each of the grooves of the first, second, third and fourth crack block grooves, and the lengths, widths, and angles of the respective grooves and gaps may be variously modified in other exemplary embodiments. Furthermore, while the exemplary embodiments of the crack blockers CB1, CB2, CB5, CB6 shown in FIGS. 4-5, 7 and 8 include two sets of plurality of crack block grooves (e.g., first crack block grooves CBG1 and second crack block grooves CBG2) and the crack blocker CB3 in the exemplary embodiment of FIG. 6 includes four sets of plurality of crack block grooves (e.g., first crack block grooves CBG1, second crack block grooves CBG2, third crack block grooves CBG3 and fourth crack block grooves CBG4), exemplary embodiments of the present inventive concepts are not limited thereto. For example, in other exemplary embodiments, the crack blocker may include any number of a plurality of sets of crack block grooves and each set of crack block grooves may include a plurality of crack block grooves that extend in a direction that is different from each of the plurality of crack block grooves of an adjacent set of crack block grooves.

Figure 9:
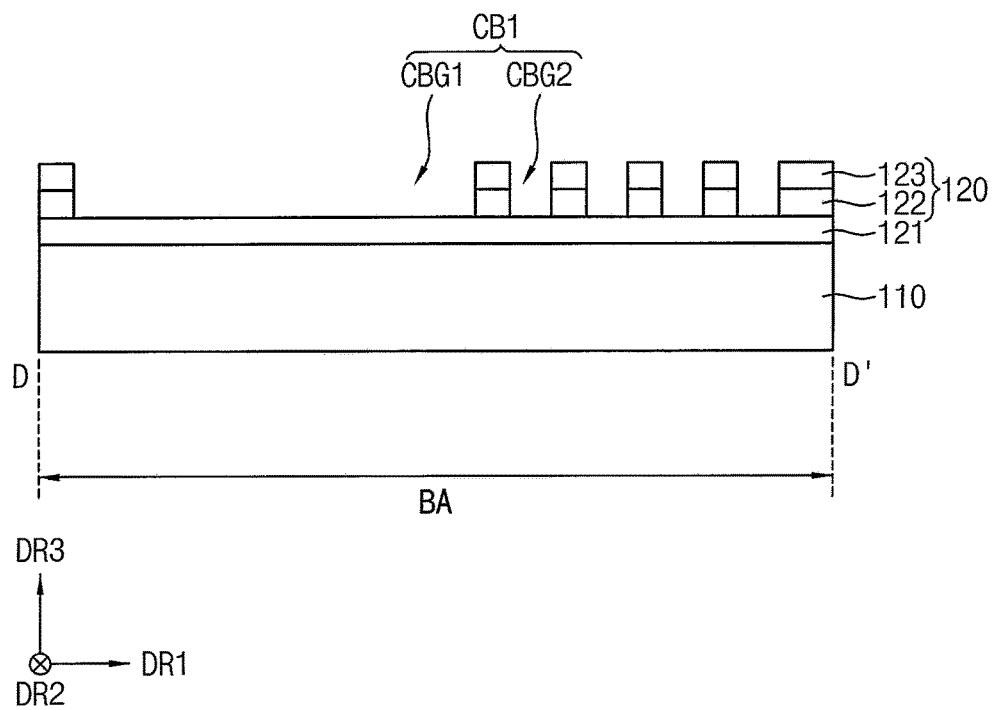
FIG. 9 is a cross-sectional view of a display device taken along line D-D' of FIG. 4 according to an exemplary embodiment of the present inventive concepts.
Figure 10:
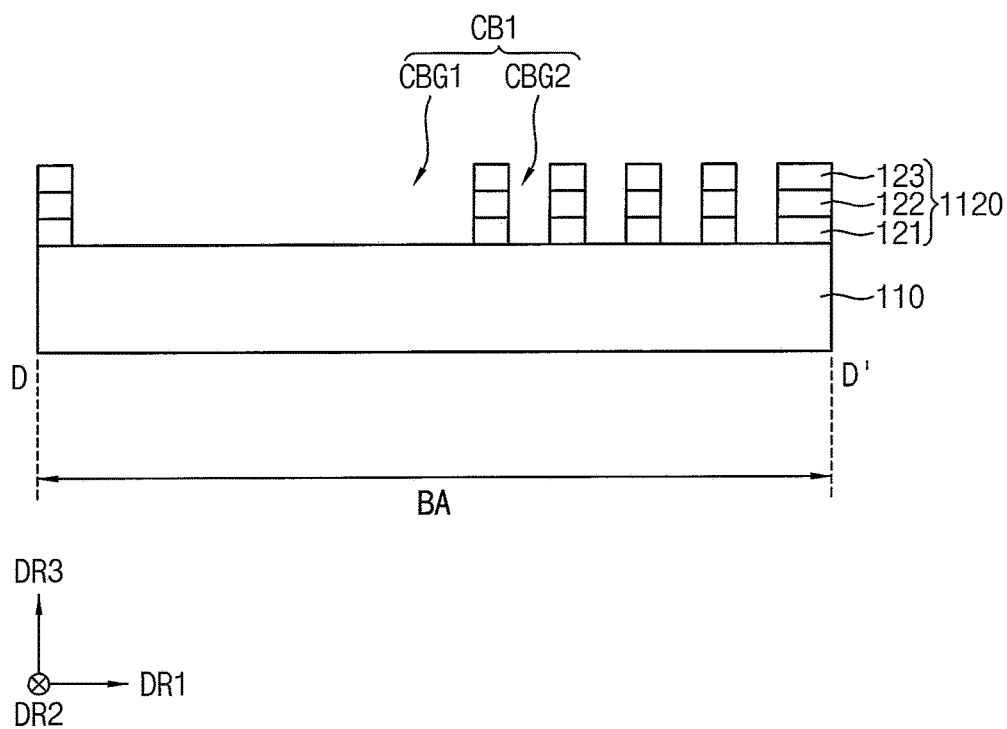
FIG. 10 is a cross-sectional view of a display device taken along line D-D' of FIG. 4 according to an exemplary embodiment of the present inventive concepts.

FIG. 9 is a cross-sectional view of a display device taken along line D-D' of FIG. 4 according to an exemplary embodiment of the present inventive concepts. FIG. 10 is a cross-sectional view of a display device taken along the line D-D' of FIG. 4 according to an exemplary embodiment of the present inventive concepts.

Referring to FIGS. 3 and 9, insulation layers 120 in the bending area BA according to an exemplary embodiment of the present inventive concepts may include the first insulation layer 122 disposed between the active layer 130 and the control electrode 142 (e.g., in the third direction DR3) and the second insulation layer 123 disposed between control electrode 142 and the input electrode 151 (e.g., in the third direction DR3) and between the control electrode 142 and the output electrode 152 (e.g., in the third direction DR3). In the exemplary embodiment shown in FIG. 3, the first crack block grooves CBG1 and the second crack block grooves CBG2 of the crack blocker CB1 may be defined in the first insulation layer 122 and the second insulation layer 123. For example, an upper surface of the buffer layer 121 may be exposed by the first crack block grooves CBG1 and the second crack block grooves CBG2. Since the first crack block grooves CBG1 and the second crack block grooves CBG2 are defined in the first insulation layer 122 and the second insulation layer 123, cracks propagated through the first insulation layer 122 and/or the second insulation layer 123 may be blocked by the crack blocker CB1 and may be prevented from propagating further to extend to the display area DA.

Referring to FIGS. 3 and 10, insulation layers 1120 according to an exemplary embodiment of the present inventive concepts may include the buffer layer 121 disposed between the substrate 110 and the active layer 130 (e.g., in the third direction DR3), the first insulation layer 122 disposed between the active layer 130 and the control electrode 142 (e.g., in the third direction DR3), and the second insulation layer 123 disposed between control electrode 142 and the input electrode 151 (e.g., in the third direction DR3) and between the control electrode 142 and the output electrode 152 (e.g., in the third direction DR3). In this exemplary embodiment, the first crack block grooves CBG1 and the second crack block grooves CBG2 of the crack blocker CB1 may be defined in the buffer layer 121, the first insulation layer 122, and the second insulation layer 123. For example, an upper surface of the substrate 110 may be exposed by the first crack block grooves CBG1 and the second crack block grooves CBG2. Since the first crack block grooves CBG1 and the second crack block grooves CBG2 are defined in the buffer layer 121, the first insulation layer 122, and the second insulation layer 123, cracks propagated through the buffer layer 121, the first insulation layer 122, and/or the second insulation layer 123 may be blocked by the crack blocker CB1 and may be prevented from propagating further to extend to the display area DA. While the exemplary embodiments shown in FIGS. 9-10 include the crack blocker CB1 extending through a plurality of insulation layers 120, exemplary embodiments of the present inventive concepts are not limited thereto. For example, in another exemplary embodiment, the crack blocker CB1 may extend through only a single insulation layer. In another exemplary embodiment, the crack blocker CB1 may extend through four or more insulation layers 120.

Figure 11:
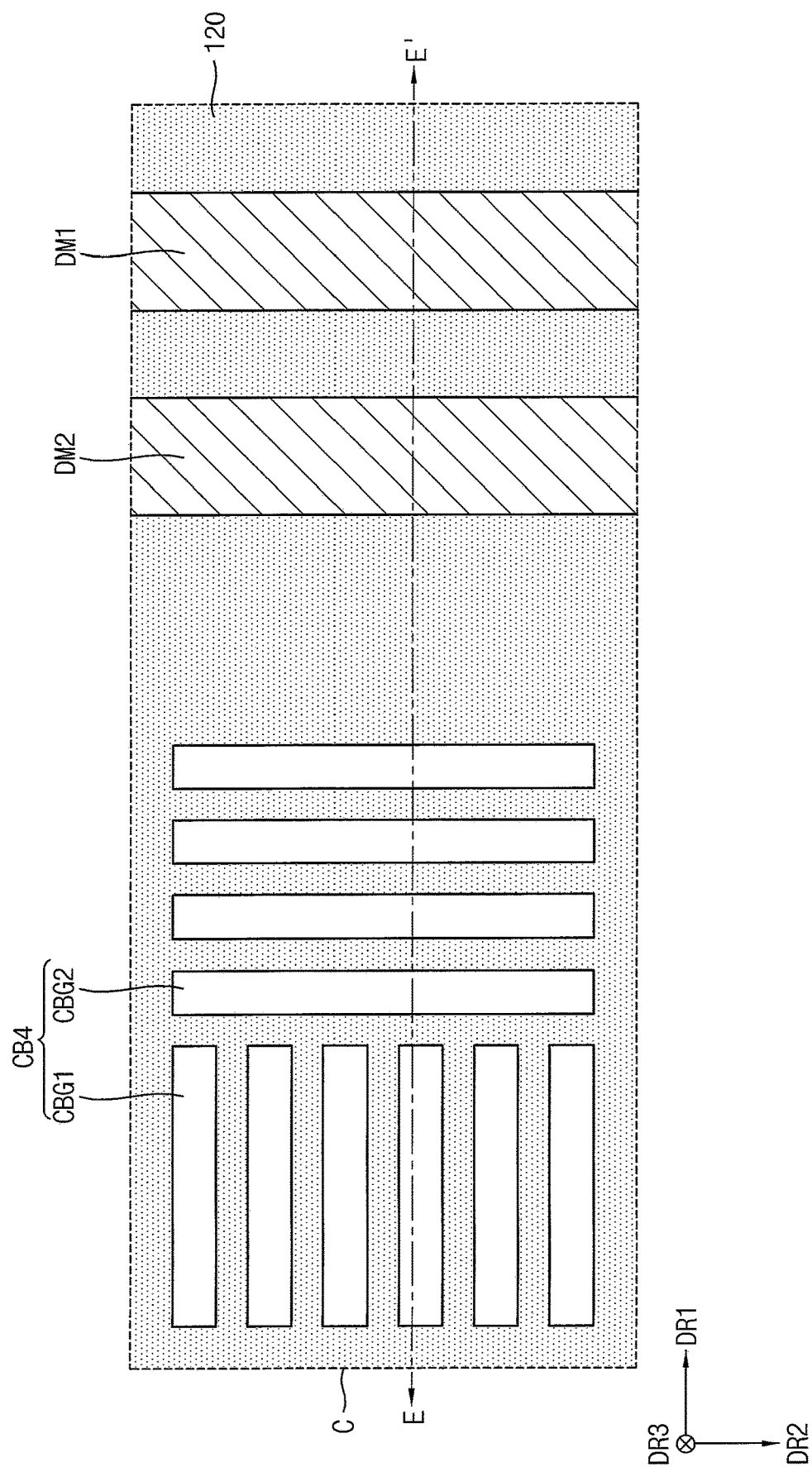
FIG. 11 is a plan view of a display device showing area C of FIG. 1 according to an exemplary embodiment of the present inventive concepts.
Figure 12:
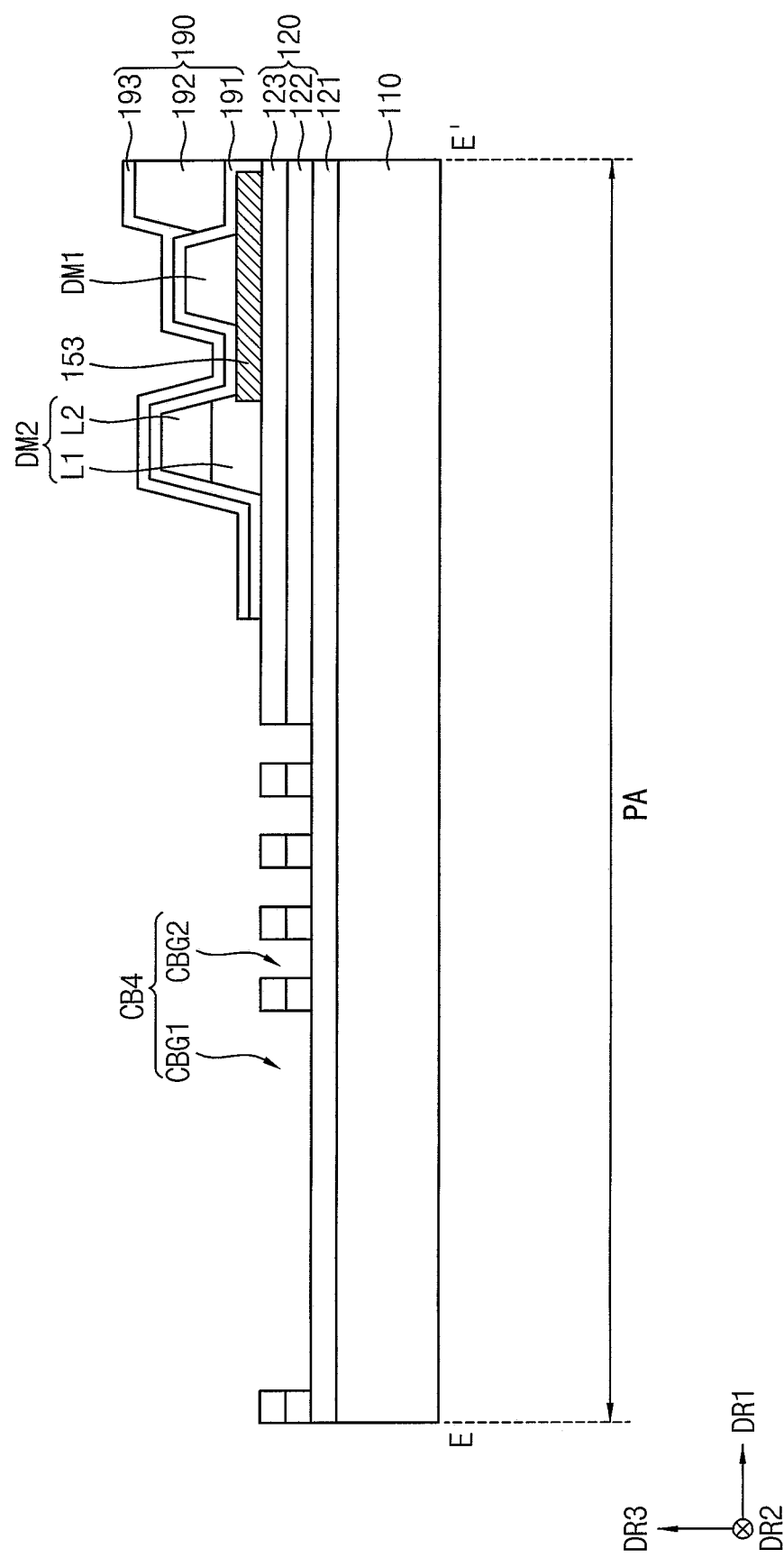
FIG. 12 is a cross-sectional view of a display device taken along line E-E' of FIG. 11 according to an exemplary embodiment of the present inventive concepts.

FIG. 11 is a plan view of a display device showing area C of FIG. 1 according to an exemplary embodiment of the present inventive concepts. For example, the area C in FIG. 1 may illustrate a left side of the peripheral area PA. FIG. 12 is a cross-sectional view of a display device taken along a line E-E' in FIG. 11 according to an exemplary embodiment of the present inventive concepts.

Referring to FIGS. 1, 3, 11, and 12, a crack blocker CB4 according to an exemplary embodiment of the present inventive concepts may be positioned in the peripheral area PA. While the crack blocker CB4 is shown positioned in area C on a left side of the peripheral area PA, the crack blocker CB4 may extend along other portions of the left side of the peripheral area PA and may extend along top, bottom, and/or right sides of the peripheral area PA. The crack blocker CB4 may include a plurality of first crack block grooves CBG1 and a plurality of second crack block grooves CBG2 defined in a plurality of insulation layers 120. Each of the first crack block grooves CBG1 may extend in the first direction DR1, and the first crack block grooves CBG1 may be arranged in the second direction DR2. Each of the second crack block grooves CBG2 may extend in the second direction DR2, and the second crack block grooves CBG2 may be arranged in the first direction DR1. Descriptions on elements of the crack blocker CB4 described with reference to FIG. 11, which are substantially the same as or similar to those of the crack blocker CB1 described with reference to the exemplary embodiment of FIG. 4, will not be repeated. Further, descriptions on elements of the insulation layers 120 described with reference to FIG. 12, which are substantially the same as or similar to those of the insulation layers 120 described with reference to the exemplary embodiment of FIG. 9, will not be repeated.

A first dam DM1 and a second dam DM2 may be disposed on the insulation layers 120 in the peripheral area PA. The crack blocker CB4 may be positioned outside the first dam DM1 and the second dam DM2. For example, the crack blocker CB4 may be positioned farther from the display area DA (e.g., in the first direction DR1) than the first dam DM1 and the second dam DM2. The second dam DM2 may be positioned between the first dam DM1 and the crack blocker CB4 (e.g., in the first direction DR1). In an exemplary embodiment, a direction in which each of the first crack block grooves CBG1 extends may cross a direction in which the first dam DM1 and the second dam DM2 extend. A direction in which each of the second crack block grooves CBG2 extends may be parallel to the direction in which the first dam DM1 and the second dam DM2 extend.

As shown in the exemplary embodiment of FIG. 12, the first dam DM1 may be disposed on a voltage supply line 153 that is disposed on the second insulation layer 123. For example, a bottom surface of the dam DM1 may directly contact an upper surface of the voltage supply line 153. The voltage supply line 153 may be disposed on a layer substantially the same as those of the input electrode 151 and the output electrode 152. In an exemplary embodiment, the voltage supply line 153 may transmit the first voltage VDD in FIG. 2 or the second voltage VSS in FIG. 2. In an exemplary embodiment, the first dam DM1 may include a material substantially the same as those of the planarization layer 160 or the pixel defining layer 180. For example, the first dam DM1 may be substantially simultaneously formed with the planarization layer 160 or the pixel defining layer 180.

The second dam DM2 may be disposed on the second insulation layer 123. The second dam DM2 may include a first layer L1 disposed on the second insulation layer 123 (e.g., in the third direction DR3) and a second layer L2 disposed on the first layer L1 (e.g., in the third direction DR3). In an exemplary embodiment, the first layer L1 of the second dam DM2 may include a material substantially the same as the material of the planarization layer 160, and the second layer L2 of the second dam DM2 may include a material substantially the same as that of the pixel defining layer 180. For example, the first layer L1 may be substantially simultaneously formed with the planarization layer 160, and the second layer L2 may be substantially simultaneously formed with the pixel defining layer 180.

The encapsulation layer 190 disposed in the display area DA may extend to the peripheral area PA to cover the first dam DM1 and the second dam DM2. For example, the first inorganic encapsulation layer 191 and the second inorganic encapsulation layer 193 of the encapsulation layer 190 may cover the first dam DM1 and the second dam DM2, and the organic encapsulation layer 192 may not cover the first dam DM1 and the second dam DM2. The first dam DM1 and the second DM2 may prevent the organic encapsulation layer 192 from being overflowed from the display area DA to the outside of the first dam DM1 and the second dam DM2 in the process of forming the organic encapsulation layer 192.

In an exemplary embodiment, the encapsulation layer 190 may not cover the crack blocker CB4. For example, an end of the first inorganic encapsulation layer 191 and an end of the second inorganic encapsulation layer 193 may be positioned between the second dam DM2 and the crack blocker CB4 (e.g., in the first direction DR1).

In this exemplary embodiment, an upper portion of the crack blocker CB4 may be exposed by the encapsulation layer 190. For example, an upper surface of the buffer layer 121, a sidewall of the first insulation layer 122, and an upper surface and a sidewall of the second insulation layer 123 in a portion in which the crack blocker CB4 is positioned may be exposed.

While the exemplary embodiment of FIG. 11 includes the crack blocker CB4 having elements and shapes similar to those of the crack blocker CB1 illustrated in the exemplary embodiment of FIG. 4, exemplary embodiments of the present inventive concepts are not limited thereto. For example, in other exemplary embodiments, the crack blocker CB4 formed in the peripheral area PA may have elements and shapes similar to those of the crack blockers illustrated in the exemplary embodiments of FIGS. 5-8. Further, the insulation layers 120 having elements similar to that of the insulation layers 120 illustrated in the exemplary embodiment of FIG. 9 is described with reference to FIG. 12. However, exemplary embodiments of the present inventive concepts are not limited thereto. In another exemplary embodiment, the insulation layers may have elements similar to that of the insulation layers 1120 illustrated in the exemplary embodiment of FIG. 10.

Figure 13:
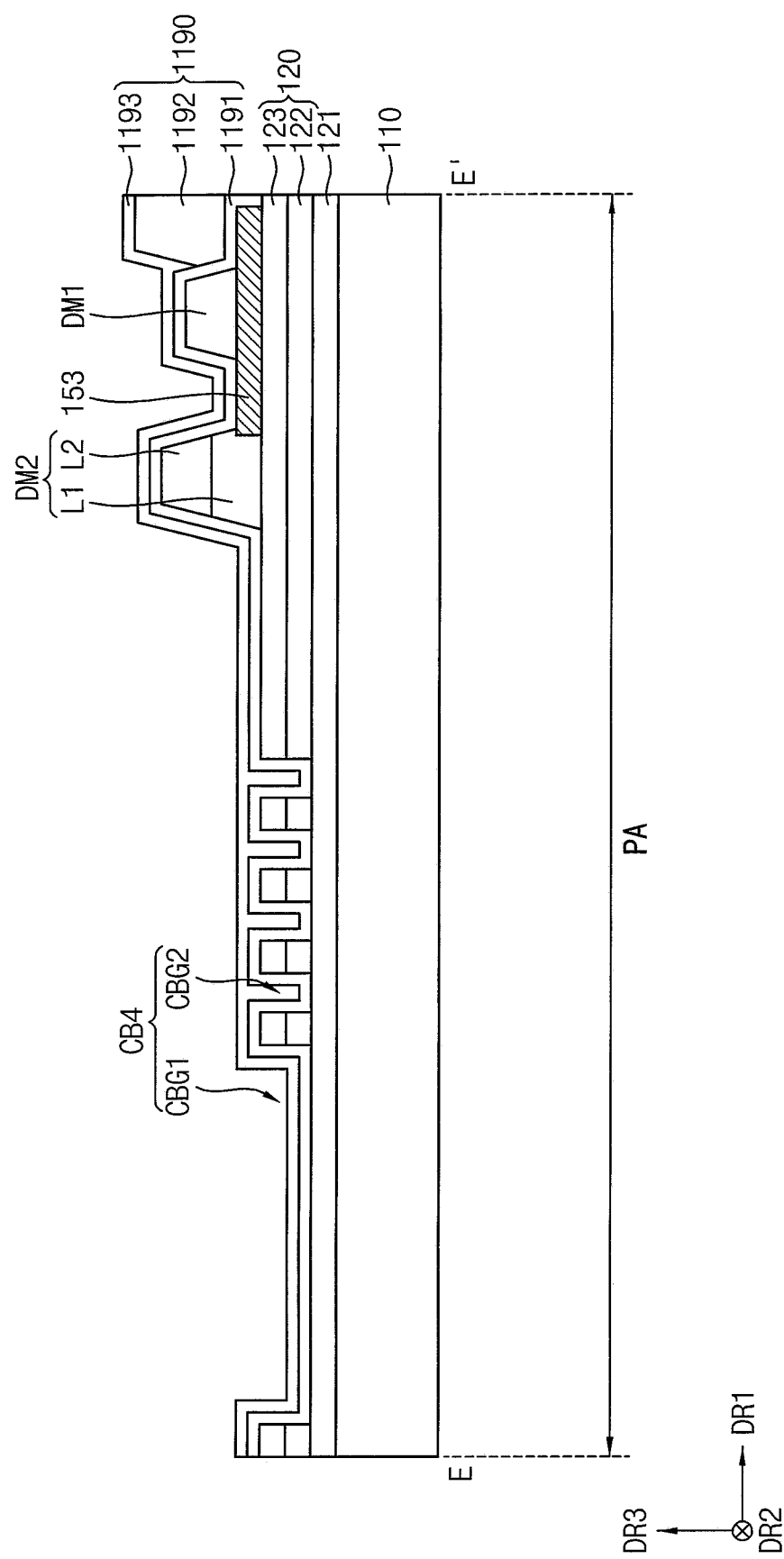
FIG. 13 is a cross-sectional view of a display device taken along line E-E' of FIG. 11 according to an exemplary embodiment of the present inventive concepts.

FIG. 13 is a cross-sectional view illustrating a display device taken along line E-E' of FIG. 11 according to an exemplary embodiment of the present inventive concepts.

Descriptions on elements of an encapsulation layer 1190 described with reference to FIG. 13, which are substantially the same as or similar to those of the encapsulation layer 190 described with reference to FIG. 12, will not be repeated.

Referring to FIG. 13, in another exemplary embodiment of the present inventive concepts, the encapsulation layer 1190 may extend to cover the crack blocker CB4, and may contact the first crack block grooves CBG1 and the second crack block grooves CBG2. For example, the first inorganic encapsulation layer 1191 and the second inorganic encapsulation layer 1193 may extend to cover the crack blocker CB4, and an end of the first inorganic encapsulation layer 1191 and an end of the second inorganic encapsulation layer 1193 may be positioned outside the crack blocker CB4. For example, the ends of the first inorganic encapsulation layer 1191 and second inorganic encapsulation layer 1193 may be farther from the display area (e.g., in the first direction DR1) than the crack blocker CB4. In this exemplary embodiment, an upper portion of the crack blocker CB4 may be covered by the encapsulation layer 1190.

An upper surface of the buffer layer 121, a sidewall of the first insulation layer 122, and an upper surface and a sidewall of the second insulation layer 123 in a portion in which the crack blocker CB4 is positioned may contact the first inorganic encapsulation layer 1191. The first inorganic encapsulation layer 1191 including an inorganic insulation material may contact the buffer layer 121, the first insulation layer 122, and the second insulation layer 123 including an inorganic insulation material, and thus the encapsulation layer 1190 may tightly contact the insulation layers 120. Accordingly, detachment of the encapsulation layer 1190 on the crack blocker CB4 or the like may be prevented, and encapsulation characteristics of the encapsulation layer 1190 may be improved. While the exemplary embodiment of FIG. 13 shows the crack blocker CB4 extending through the first insulation layer 122 and second insulation layer 123, in other exemplary embodiments, the crack blocker CB4 may also extend through the buffer layer 121 as shown in the exemplary embodiment of FIG. 10. In this exemplary embodiment, an upper surface of the substrate 110, a sidewall of the buffer layer 121, a sidewall of the first insulation layer 122, and an upper surface and a sidewall of the second insulation layer 123 in a portion in which the crack blocker CB4 is positioned may contact the first inorganic encapsulation layer 1191.

While the exemplary embodiments show the crack blocker disposed in area B of the bending area BA and area C of the peripheral area PA, at least one crack blocker may be disposed in any portion of the non-display area NDA including any portion of the peripheral area PA and the bending area BA. Furthermore, a plurality of different types of crack blockers may be disposed in the peripheral area PA and the bending area BA.

The display device according to an exemplary embodiment of the present inventive concepts may be applied to a display device included in a computer, a notebook, a mobile phone, a smartphone, a smart pad, a PMP, a PDA, an MP3 player, or the like. However, exemplary embodiments of the present inventive concepts are not limited thereto and the display device may be applied to various other large-sized, medium-sized or small-sized electronic devices.

Although the display device according to exemplary embodiments of the present inventive concepts have been described with reference to the drawings, the illustrated embodiments are only examples, and may be modified and changed by a person having ordinary knowledge in the relevant technical field without departing from the technical spirit of the present inventive concepts.

What is claimed is:

1. A display device, comprising:
a substrate including a display area and a non-display area;
a plurality of insulation layers disposed on the substrate;
a pixel disposed on the substrate in the display area, the pixel including a transistor and a light emitting element electrically connected to the transistor; and
a crack blocker disposed on the substrate in the non-display area, the crack blocker including:
a plurality of first crack block grooves defined in at least one of the plurality of the insulation layers, each of the plurality of first crack block grooves extending in a first direction, and arranged in a second direction crossing the first direction; and
a plurality of second crack block grooves defined in the at least one of the plurality of insulation layers, adjacent to the plurality of first crack block grooves, each of the plurality of second crack Mock grooves extending in the second direction, and arranged in the first direction,
wherein all crack block grooves of the crack blocker extending in the first direction are discontinuous from all crack block grooves of the crack blocker extending in the second direction.

2. The display device of claim 1, wherein the plurality of second crack block grooves are adjacent to the plurality of first crack block grooves in the first direction.

3. The display device of claim 2, wherein the crack blocker further includes:
a plurality of third crack block grooves defined in the plurality of insulation layers, adjacent to the plurality of first crack block grooves in the second direction, each of the plurality of third crack block grooves extending in the second direction, and arranged in the first direction.

4. The display device of claim 3, wherein the crack blocker further includes:
a plurality of fourth crack block grooves defined in the plurality of insulation layers, adjacent to the plurality of third crack block grooves in the first direction, each of the plurality of fourth crack block grooves extending in the first direction, and arranged in the second direction.

5. The display device of claim 4, wherein the plurality of fourth crack block grooves are adjacent to the plurality of second crack block grooves in the second direction.

6. The display device of claim 1, wherein the second direction is perpendicular to the first direction.

7. The display device of claim 1, Wherein the first direction is parallel to a scan line providing a scan signal to the pixel.

8. The display device of claim 1, wherein the crack blocker has a square or rectangular shape in a plan view.

9. The display device of claim 1, wherein the plurality of first crack block grooves and the plurality of second crack block grooves have a stripe shape in a plan view.

10. The display device of claim 1, wherein the transistor includes:
an active layer;
a control electrode insulated from the active layer and overlapping the active layer in a thickness direction of the substrate;
an input electrode insulated from the control electrode and connected to a first lateral side of the active layer; and
an output electrode insulated from the control electrode and connected to a second lateral side of the active layer, and
wherein the plurality of insulation layers includes:
a first insulation layer disposed between the active layer and the control electrode; and
a second insulation layer disposed between the control electrode and the input electrode.

11. The display device of claim 10, wherein the plurality of insulation layers further includes a buffer layer disposed between the substrate and the active layer.

12. The display device of claim 1, wherein each of the plurality of insulation layers includes an inorganic insulation material.

13. The display device of claim 1, wherein:
the non-display area includes a bending area positioned at a side of the display area, and
wherein the crack blocker is positioned at a side of the bending area.

14. The display device of claim 1, wherein:
the non-display area includes a peripheral area surrounding the display area, and
wherein the crack blocker is positioned in the peripheral area.

15. The display device of claim 1, wherein an upper surface of the substrate is exposed by the plurality of first crack block grooves and the plurality of second crack block grooves.

16. The display device of claim 1, further comprising:
an encapsulation layer disposed on the pixel in the display area,
wherein the encapsulation layer extends to the non-display area and covers the crack blocker, the encapsulation layer directly contacting the plurality of first crack block grooves and the plurality of second crack block grooves.

17. The display device of claim 16, wherein the encapsulation layer includes:
a first inorganic encapsulation layer;
an organic encapsulation layer disposed on the first inorganic encapsulation layer; and
a second inorganic encapsulation layer disposed on the organic encapsulation layer, and
wherein the first inorganic encapsulation layer and the second inorganic encapsulation layer extend to cover the crack blocker,
wherein the first inorganic encapsulation layer directly contacts the plurality of first crack block grooves and the plurality of second crack block grooves.

18. The display device of claim 1, wherein the light emitting element includes:
a first electrode;
a second electrode spaced apart from the first electrode and overlapping the first electrode; and
an emission layer disposed between the first electrode and the second electrode.

19. The display device of claim 1, herein:
each of the plurality of second crack block grooves intersects a gap between adjacent first crack block grooves of the plurality of first crack block grooves.

20. A display device, comprising:
a substrate having a display area that includes at least one pixel and a non-display area that includes a peripheral area surrounding the display area;
a plurality of insulation layers disposed on the substrate;

at least one dam disposed on the plurality of insulation layers in the peripheral area, the at least one dam extending in a first direction parallel to an upper surface of the substrate;

a crack blocker disposed on the substrate in the peripheral area, the crack blocker is disposed farther from the display area than the at least one dam in a second direction that is parallel to the upper surface of the substrate, wherein the crack blocker includes;

a plurality of first crack block grooves defined in at least one of the plurality of the insulation layers, each of the plurality of first crack block grooves extending in a third direction crosses the first direction; and a plurality of second crack block grooves defined in the plurality of insulation layers adjacent to the plurality of first crack block grooves in the second direction, the plurality of second crack block grooves extending in the first direction, wherein all crack block grooves of the crack blocker extending in the third direction are discontinuous from all crack block grooves of the crack blocker extending in the first direction.

21. The display device of claim 20, wherein each of the plurality of second crack block grooves intersects a gap between adjacent first crack block grooves of the plurality of first crack block grooves.

22. A display device, comprising:

a substrate having a display area that includes at least one pixel and a non-display area;

a plurality of insulation layers disposed on the substrate;

a crack blocker disposed on the substrate in the non-display area, Wherein the crack blocker includes:

a plurality of sets of crack block grooves defined in at least one of the plurality of the insulation layers and arranged adjacent to each other in a first direction parallel to an upper surface of the substrate and/or a second direction that is parallel to the upper surface of the substrate and perpendicular to the first direction, wherein each set of crack block grooves includes a plurality of crack block grooves that extend in a direction that is different from each of the plurality of crack block grooves of an adjacent set of crack block grooves, wherein all sets of crack block grooves of the crack blocker are discontinuous from all adjacent sets of crack block grooves of the crack blocker.

23. The display device of claim 22, wherein each of the plurality of crack grooves intersects a gap between adjacent crack block grooves of the adjacent set of crack block grooves.

* * * * *